US012682966B2

(12) United States Patent
Date

(10) Patent No.: US 12,682,966 B2
(45) Date of Patent: Jul. 14, 2026

(54) SEMICONDUCTOR MEMORY DEVICE CONTROLLING VOLTAGES SUPPLIED TO RESPECTIVE WORD LINES IN DIFFERENT PERIODS OF A PROGRAM OPERATION

(71) Applicant: Kioxia Corporation, Tokyo (JP)

(72) Inventor: Hiroki Date, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 87 days.

(21) Appl. No.: 18/637,474

(22) Filed: Apr. 17, 2024

(65) Prior Publication Data

US 2024/0420782 A1     Dec. 19, 2024

(30) Foreign Application Priority Data

Jun. 13, 2023     (JP) ................................. 2023-097084

(51) Int. Cl.
| | |
|---|---|
| *G11C 16/34* | (2006.01) |
| *G11C 11/56* | (2006.01) |
| *G11C 16/04* | (2006.01) |
| *G11C 16/08* | (2006.01) |
| *G11C 16/10* | (2006.01) |
| *G11C 16/30* | (2006.01) |
| *G11C 16/32* | (2006.01) |

(52) U.S. Cl.
CPC ...... *G11C 16/3459* (2013.01); *G11C 11/5628* (2013.01); *G11C 16/0483* (2013.01); *G11C 16/08* (2013.01); *G11C 16/10* (2013.01); *G11C 16/102* (2013.01); *G11C 16/30* (2013.01); *G11C 16/32* (2013.01)

(58) Field of Classification Search
CPC ... G11C 16/3459; G11C 16/08; G11C 16/102; G11C 11/5628; G11C 16/0483; G11C 16/10; G11C 16/30; G11C 16/32
See application file for complete search history.

(56) References Cited

U.S. PATENT DOCUMENTS

| | | | |
|---|---|---|---|
| 9,792,996 B1 | 10/2017 | Date | |
| 10,418,118 B2 | 9/2019 | Date | |
| 10,622,079 B2 | 4/2020 | Date | |
| 10,685,689 B2 | 6/2020 | Date | |
| 11,335,388 B2 | 5/2022 | Date | |
| 11,749,348 B2 | 9/2023 | Date | |
| 2018/0053559 A1 | 2/2018 | Kaneko et al. | |
| 2019/0287995 A1* | 9/2019 | Oike ...................... H10B 41/10 |
| 2022/0254393 A1 | 8/2022 | Date | |
| 2022/0328112 A1* | 10/2022 | Yang ................... G11C 11/5628 |

FOREIGN PATENT DOCUMENTS

JP     2018028958 A     2/2018

* cited by examiner

*Primary Examiner* — Alexander Sofocleous
*Assistant Examiner* — Joseph Fidelis Stormes
(74) *Attorney, Agent, or Firm* — Holtz, Holtz & Volek PC

(57) ABSTRACT
According to one embodiment, a semiconductor memory device includes a first memory cell and a second memory cell arranged adjacent to each other and coupled in series; and a control circuit, wherein the control circuit is configured to: at a time of the program operation in a first program loop operation targeted for the first memory cell, during a first period, while suppling a first write voltage to the first memory cell, supply a first voltage smaller than the first write voltage to the second memory cell, and during a second period, while supplying a second voltage smaller than the first voltage to the first memory cell, supply a third voltage greater than the second voltage to the second memory cell.

10 Claims, 11 Drawing Sheets

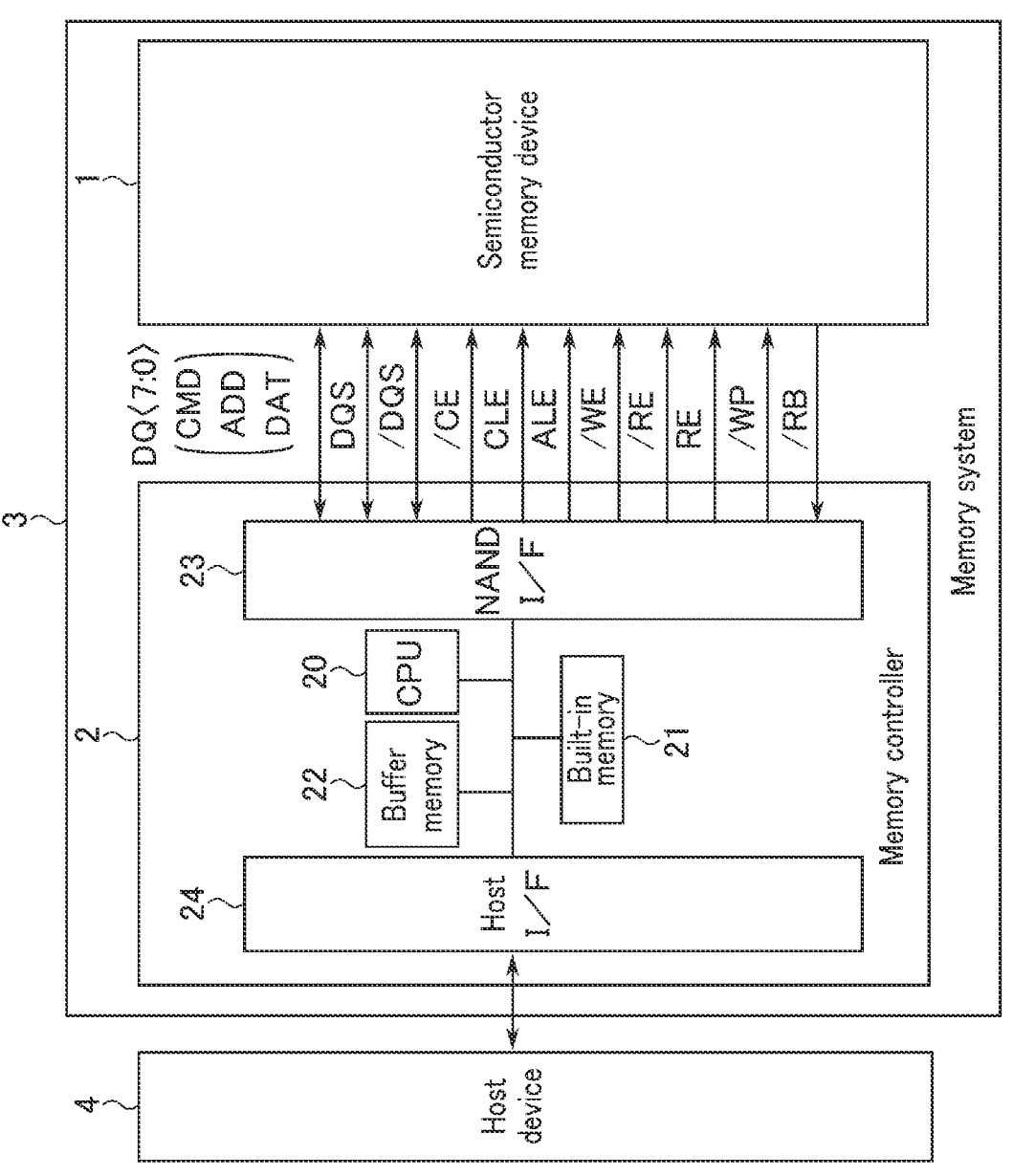
F I G. 1

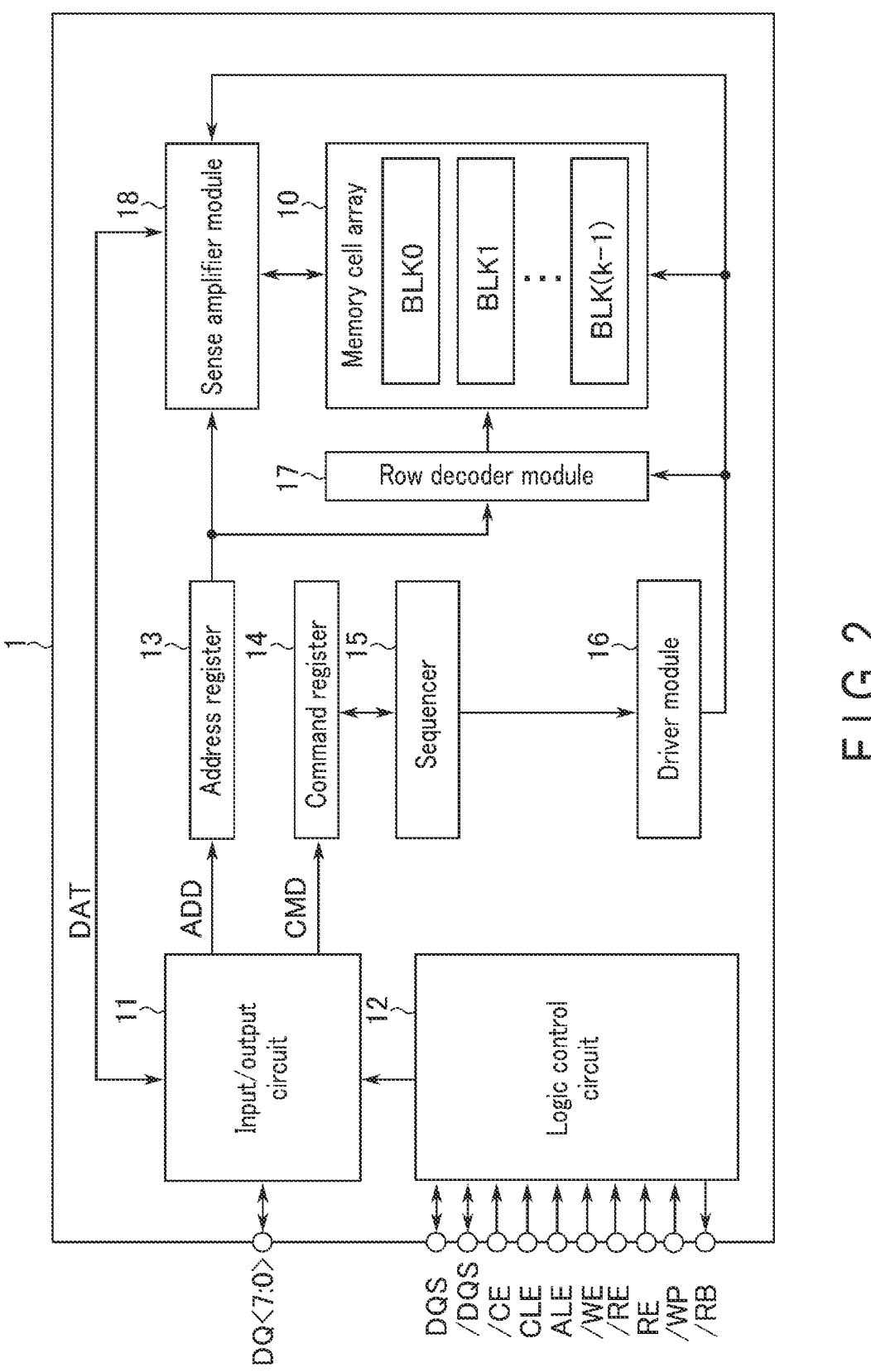
F I G. 2

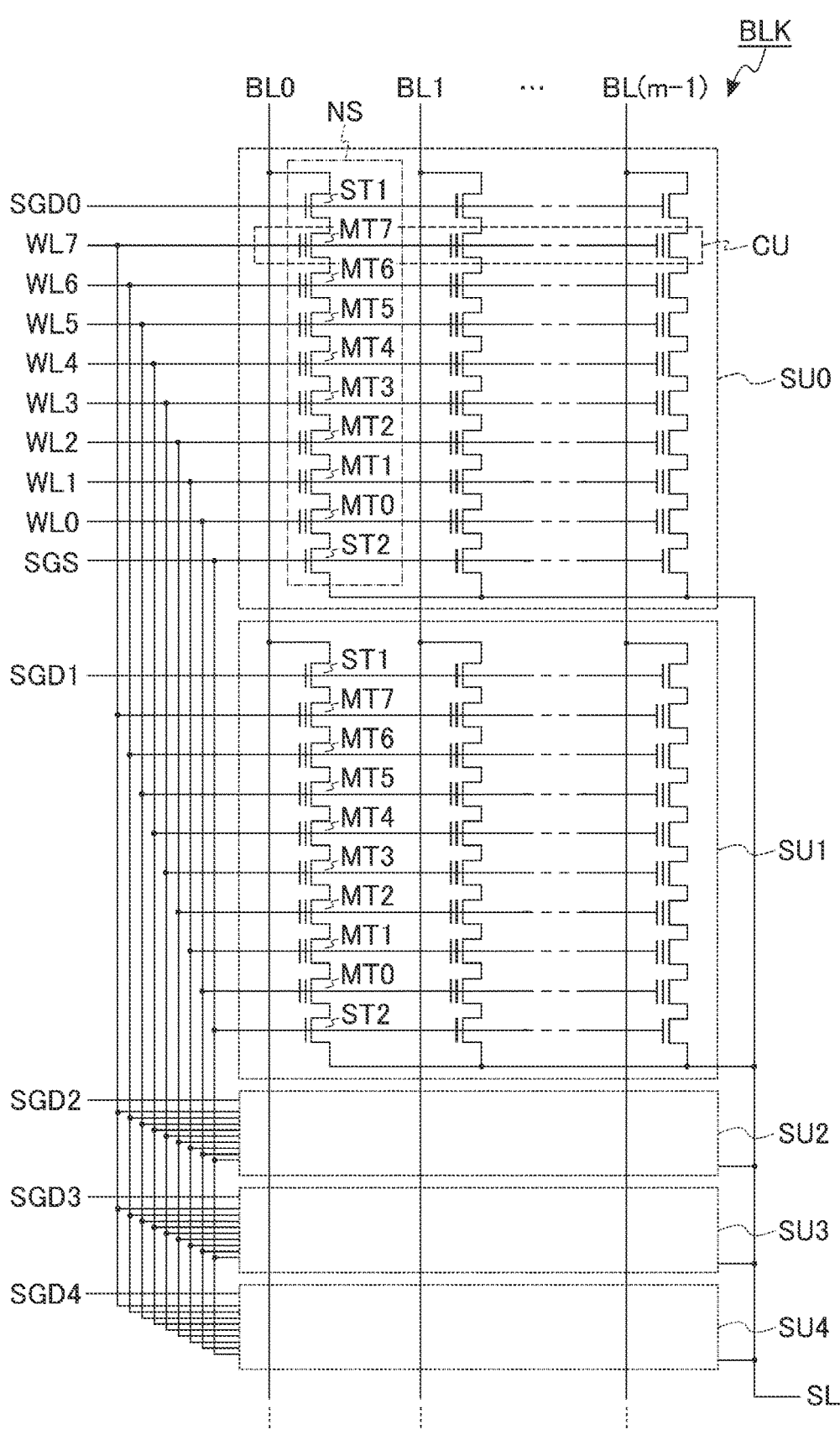
F I G. 3

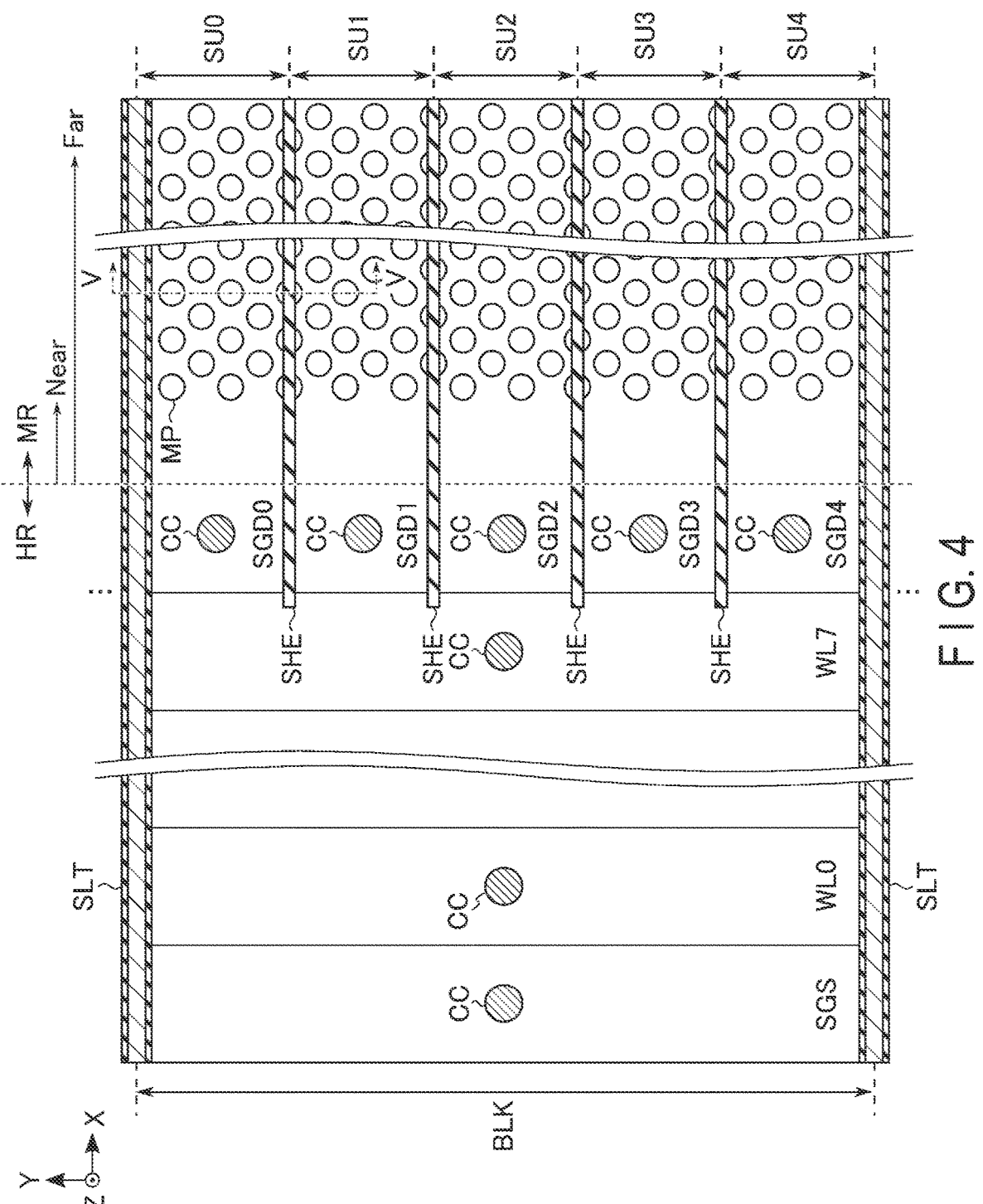
F I G. 4

| Page | Data | | | | | | | |
|------|------|------|------|------|------|------|------|------|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

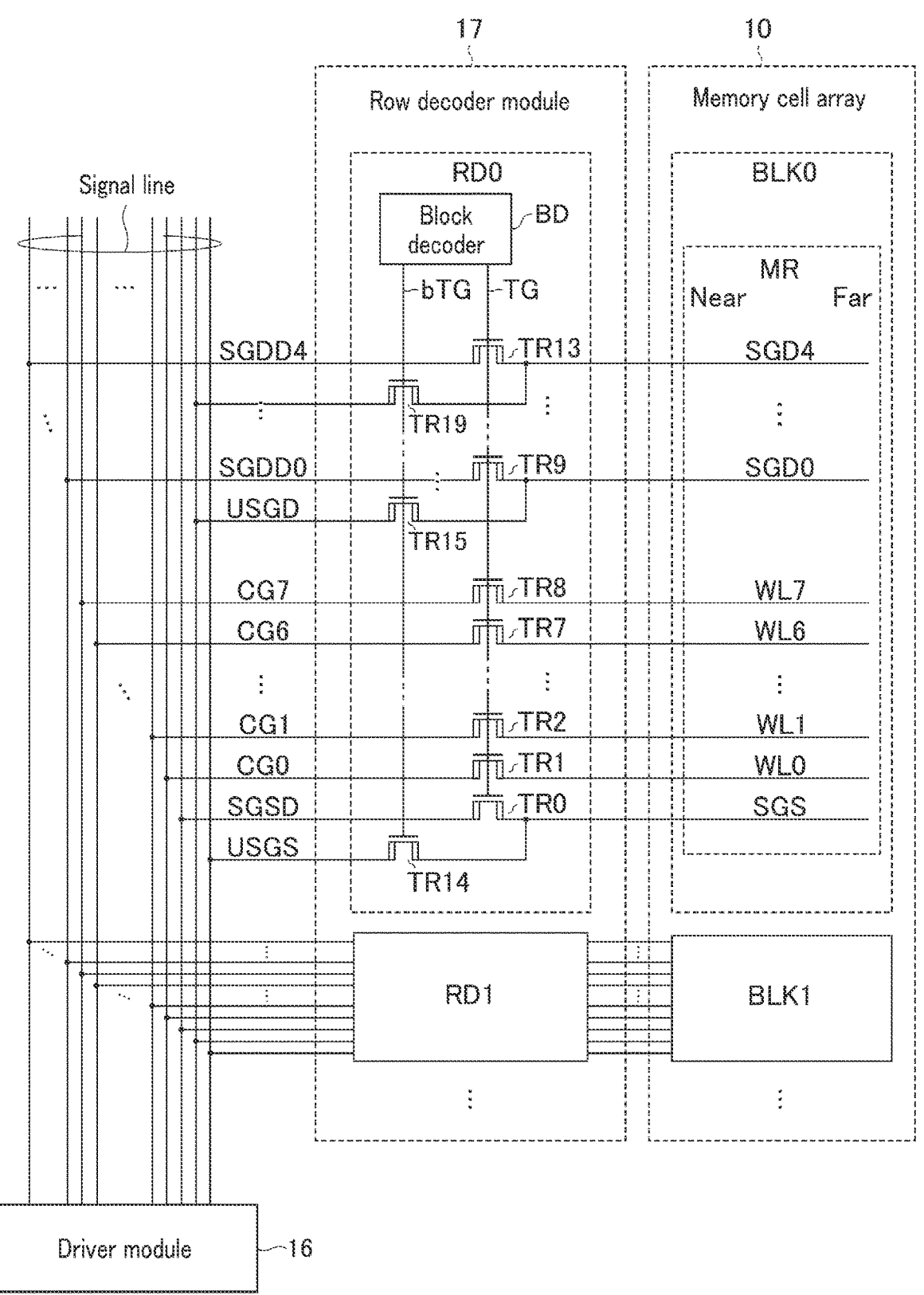
F I G. 8

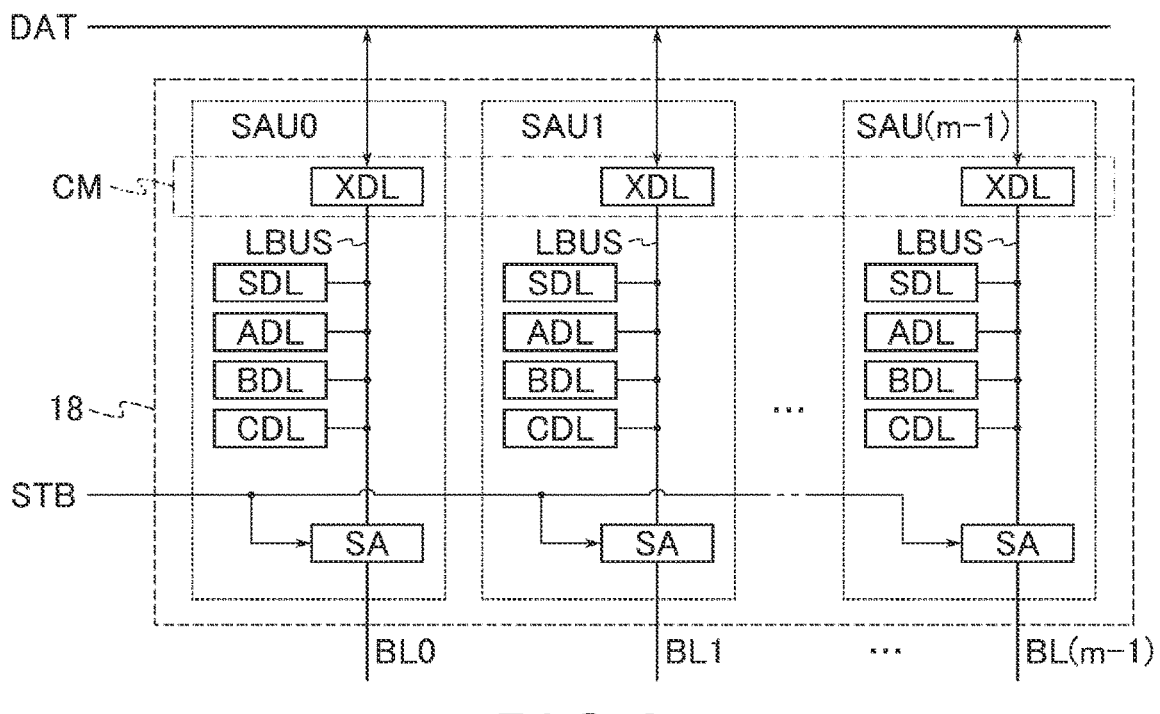
F I G. 9
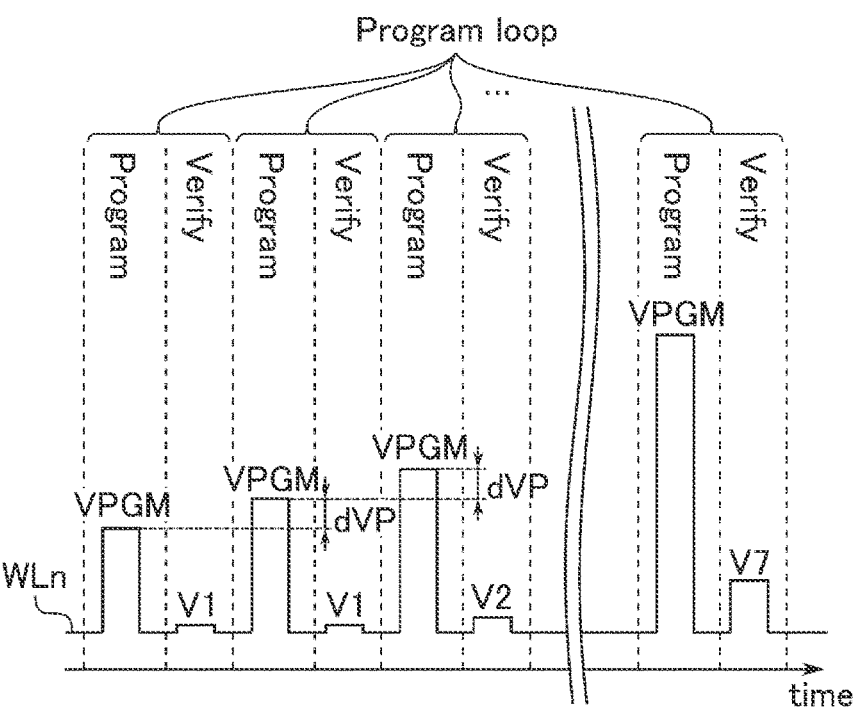
F I G. 10

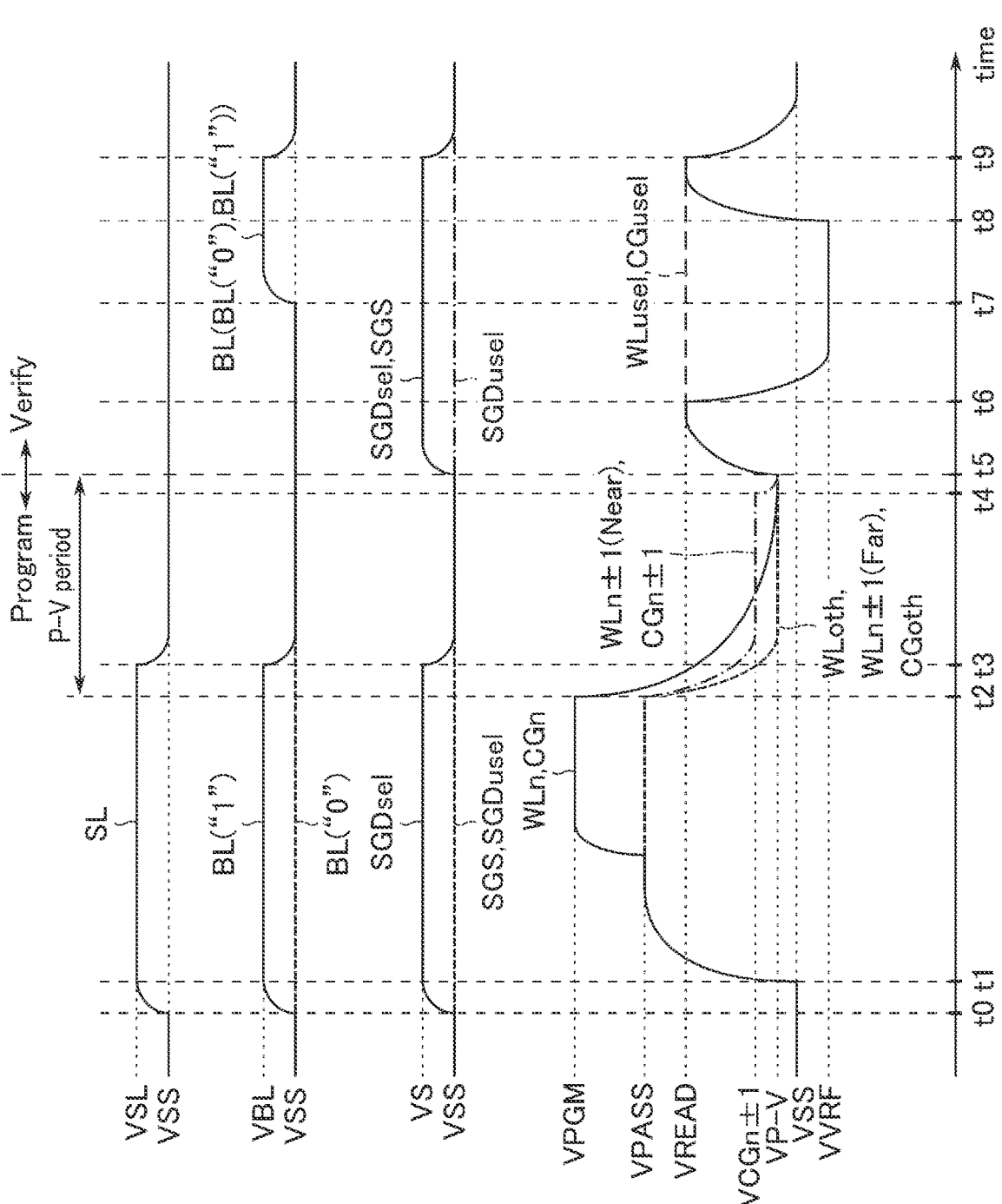
F I G. 11

| | | SecW1 | | | SecW2 | | | SecW3 | |
|---|---|---|---|---|---|---|---|---|---|
| Loop number | 1 | ⋯ | 6 | 7 | ⋯ | 12 | 13 | ⋯ | 18 |
| VPGM | VP(1) | ⋯ | VP(6) | VP(7) | ⋯ | VP(12) | VP(13) | ⋯ | VP(18) |
| VCGn±1 | VC(1) | ⋯ | VC(1) | VC(2) | ⋯ | VC(2) | VC(3) | ⋯ | VC(3) |

F I G. 12

SEMICONDUCTOR MEMORY DEVICE CONTROLLING VOLTAGES SUPPLIED TO RESPECTIVE WORD LINES IN DIFFERENT PERIODS OF A PROGRAM OPERATION

CROSS-REFERENCE TO RELATED APPLICATIONS

This application is based upon and claims the benefit of priority from Japanese Patent Application No. 2023-097084, filed Jun. 13, 2023, the entire contents of which are incorporated herein by reference.

FIELD

Embodiments described herein relate generally to a semiconductor memory device.

BACKGROUND

There is known a NAND flash memory as a semiconductor memory device capable of storing data in a nonvolatile manner. A NAND flash memory adopts a three-dimensional memory structure for higher integration and higher capacity.

BRIEF DESCRIPTION OF THE DRAWINGS

FIG. 1 is a block diagram showing an example of a configuration of a memory system including a semiconductor memory device according to an embodiment, and a host device.

FIG. 2 is a block diagram showing an example of a configuration of the semiconductor memory device according to the embodiment.

FIG. 3 is a circuit diagram for explaining an example of a configuration of a memory cell array of the semiconductor memory device according to the embodiment.

FIG. 4 is a planar view shown an example of a planar layout of the memory cell array of the semiconductor memory device according to the embodiment.

FIG. 8 is a block diagram showing one example of a configuration of the memory cell array, a driver module, and the row decoder module included in the semiconductor memory device according to the embodiment.

FIG. 9 is a block diagram showing one example of a configuration of the sense amplifier module of the semiconductor memory device according to the embodiment.

FIG. 10 is a timing chart showing an overview of a write operation of the semiconductor memory device according to the embodiment.

FIG. 11 is a timing chart showing an example of a program loop operation of the semiconductor memory device according to the embodiment.

FIG. 12 is a table for explaining a write operation using a semiconductor memory device according to a modification.

DETAILED DESCRIPTION

Figure 5:
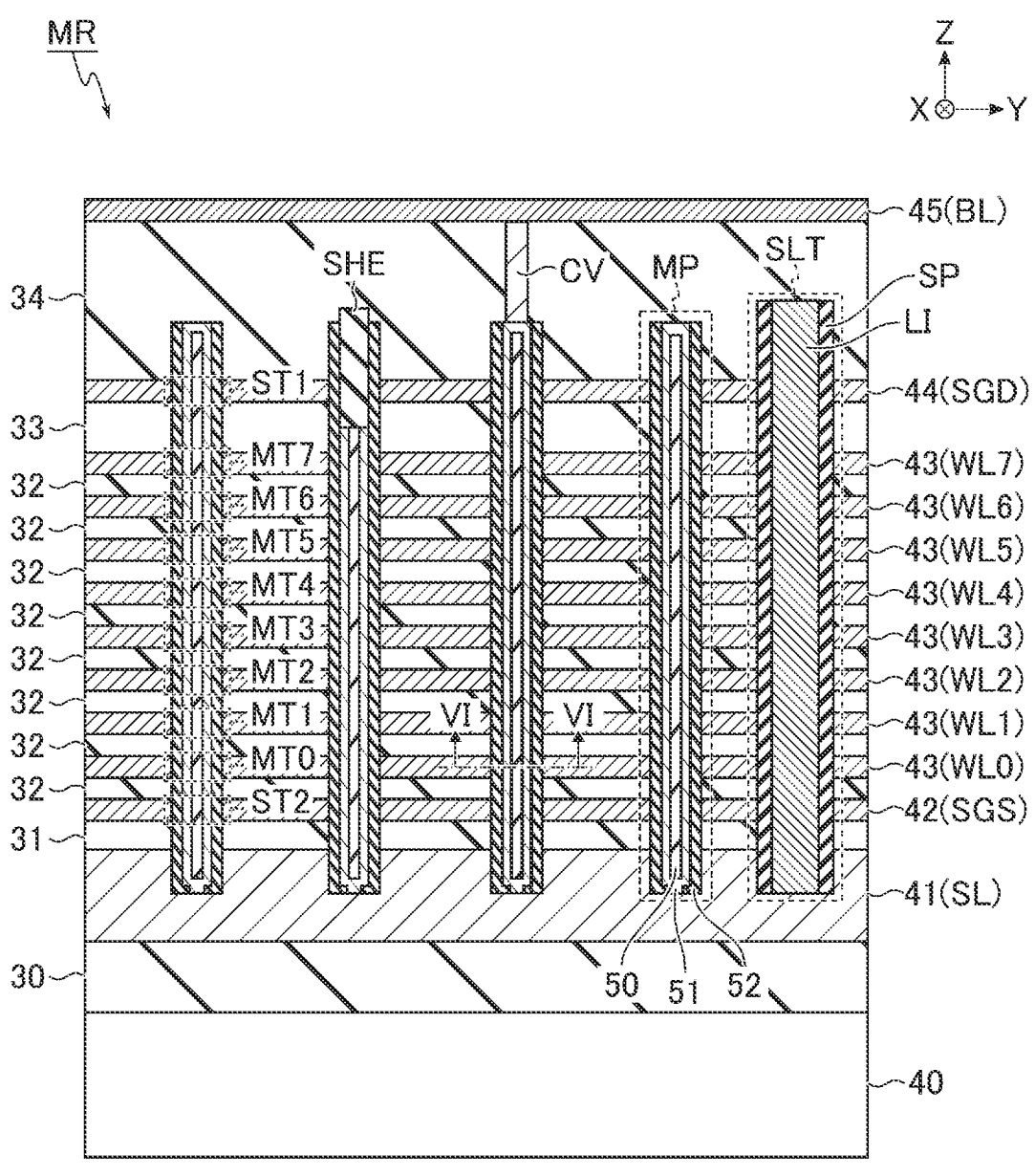
FIG. 5 is a cross-sectional view, taken along line V-V of FIG. 4, showing an example of a cross-sectional structure of the memory cell array of the semiconductor memory device according to the embodiment.

In general, according to one embodiment, a semiconductor memory device includes: a first memory cell and a second memory cell arranged adjacent to each other and coupled in series; a first word line coupled to the first memory cell; a second word line coupled to the second memory cell; and a control circuit, wherein the control circuit is configured to: execute a plurality of program loop operations each including a program operation and a verify operation subsequent to the program operation; and at a time of the program operation in a first program loop operation included in the plurality of program loop operations and targeted for the first memory cell, during a first period, while suppling a first write voltage to the first word line, supply a first voltage smaller than the first write voltage to the second word line, and during a second period subsequent to the first period, while supplying a second voltage smaller than the first voltage to the first word line, supply a third voltage greater than the second voltage to the second word line.

Hereinafter, embodiments will be described with reference the accompanying drawings. The dimensions and ratios in the drawings are not always the same as the actual ones. The description will use the same reference symbols for structural features or components having the same or substantially the same functions and configurations. For the purpose of distinguishing between elements having the same or substantially the same configurations, the description may add different characters or numerals after their respective reference signs.

1. EMBODIMENTS

Hereinafter, a semiconductor memory device according to an embodiment will be described.
1.1 Configuration
First, a configuration of the semiconductor memory device according to the embodiment will be described.
1.1.1 Memory System
The description starts with a configuration of a memory system by referring to FIG. 1. FIG. 1 is a block diagram showing an example of a configuration of a memory system including a semiconductor memory device according to an embodiment, and a host device.

A memory system 3 is, for example, a solid state drive SSD), an SD™ card, etc. The memory system 3 is coupled to an external host device 4, for example. The memory system 3 stores data supplied from the host device 4. The memory system 3 reads data into the host device 4.

The memory system 3 includes a semiconductor memory device 1 and a memory controller 2. The semiconductor memory device 1 and the memory controller 2 may be combined to constitute one semiconductor device.

The semiconductor memory device 1 is a NAND-type flash memory, for example. The semiconductor memory device 1 is configured to store data in a nonvolatile manner. The semiconductor memory device 1 is coupled to the memory controller 2 via a NAND bus. In the following, a case will be described in which the semiconductor memory device 1 is a NAND-type flash memory.

The NAND bus transmits and receives signals DQ<7:0>, DQS, /DQS, /CE, CLE, ALE, /WE, /RE, RE, /WP, and /RB, which comply with a NAND interface, via individual signal lines, respectively. The signal /CE is a chip enable signal. The signal /CE is a signal for enabling the semiconductor memory device 1. The signal CLE is a command latch enable signal. The semiconductor memory device 1 is notified of the fact that the signal DQ<7:0> flowing into the semiconductor memory device 1 is a command while the signal CLE is at the "H (high)" level. The signal ALE is an address latch enable signal. The semiconductor memory device 1 is notified of the fact that the signal DQ<7:0> flowing into the semiconductor memory device 1 is an address while the signal ALE is at the "H" level. The signal /WE is a write enable signal. The signal /WE instructs the semiconductor memory device 1 to fetch the signal DQ<7:0>. For example, the signal /WE instructs the semiconductor memory device 1 to fetch the DQ<7:0> as a command, an address, or data, at a rising edge of the signal /WE at a single data rate (SDR). Furthermore, the signal /WE instructs the semiconductor memory device 1 to fetch the signal DQ<7:0> as a command or an address, at a rising edge of the signal /WE at a double data rate (DDR). The signal /RE is a read enable signal. The signal /RE is an instruction for the semiconductor memory device 1 to output the signal DQ<7:0>. For example, the signal /RE instructs the semiconductor memory device 1 to output the signal DQ<7:0> as data, at a falling edge of the signal /RE at a single data rate. Furthermore, the signal /RE instructs the semiconductor memory device 1 to output the signal DQ<7:0> as data, at a falling edge or a rising edge of the signal /RE at a double data rate. The signal RE is a complementary signal to the signal /RE. The signal /WP is a write protect signal. The signal /WP instructs the semiconductor memory device 1 to prohibit data writing and data erasing. The signal /RB is a ready busy signal. The signal /RB is an indication that the semiconductor memory device 1 is in a ready state (the state in which an external command is accepted) or a busy state (the state in which an external command is not accepted). The signal DQ<7:0> is, for example, an 8-bit signal. The signal DQS is a data strobe signal. The signal DQS is used to control the operation timing of the semiconductor memory device 1 related to the signal DQ<7:0>. For example, the signal DQS instructs the semiconductor memory device 1 to fetch the high signal DQ<7:0> as data, at a falling edge or a rising edge of the signal DQS at a double data rate. Furthermore, the signal DQS is generated based on a falling edge or a rising edge of the signal /RE at a double data rate. The signal DQS is output together with the signal DQ<7:0> from the semiconductor memory device 1. The signal /DQS is a complementary signal of the signal DQS.

The signal DQ<7:0> is communicated between the semiconductor memory device 1 and the memory controller 2, and includes a command CMD, an address ADD, and data DAT. Examples of the command CMD include a command (erase command) for causing the semiconductor memory device 1 to execute an erase operation, a command (write command) for causing the semiconductor memory device 1 to execute a write operation, and a command (read command) for causing the semiconductor memory device 1 to execute a read operation. The data DAT includes read data and write data.

The memory controller 2 receives a command from the host device 4. The memory controller 2 controls the semiconductor memory device 1 based on the received command. Specifically, based on the write command received from the host device 4, the memory controller 2 writes data, which is instructed to be written, in the semiconductor memory device 1. In addition, the memory controller 2 reads data, which is instructed to be read by the host device 4, from the semiconductor memory device 1 based on a read command received from the host device 4, and transmits the read data to the host device 4.

Examples of the host device 4 that makes use of the memory system 3 described above include a digital camera, a personal computer, and a server in a data center, etc.

1.1.2 Memory Controller

A configuration of the memory controller 2 will be described with reference to FIG. 1.

The memory controller 2 includes a central processing unit (CPU) 20, a built-in memory 21, a buffer memory 22, a NAND interface circuit (NAND I/F) 23, and a host interface circuit (host I/F) 24. The memory controller 2 is configured as, for example, a system-on-a-chip (SoC).

The CPU 20 controls operations of the entire memory controller 2. The CPU 20 issues commands for instructing the semiconductor memory device 1 to execute various operations such as a write operation, a read operation, and an erase operation.

The built-in memory 21 is a semiconductor memory such as a DRAM. The built-in memory 21 is used as a working area of the CPU 20. The built-in memory 21 stores firmware, various management tables, etc., for managing the semiconductor memory device 1.

The buffer memory 22 temporarily stores write data received from the host device 4, read data received by the memory controller 2 from the semiconductor memory device 1, etc.

The NAND interface circuit 23 is coupled to the semiconductor memory device 1 via a NAND bus, and controls communications with the semiconductor memory device 1. The NAND interface circuit 23 transmits the command CMD, the address ADD, and the write data to the semiconductor memory device 1, in accordance with instructions from the CPU 20. The NAND interface circuit 23 receives read data from the semiconductor memory device 1.

The host interface circuit 24 is coupled to the host device 4 via a host bus, and controls communications between the memory controller 2 and the host device 4. The host interface circuit 24 transfers, for example, commands and data received from the host device 4 to the CPU 20 and the buffer memory 22, respectively.

1.1.3 Semiconductor Memory Device

Next, an internal configuration of the semiconductor memory device 1 will be described with reference to FIG. 2. FIG. 2 is a block diagram showing an example of a configuration of the semiconductor memory device according to the embodiment.

The semiconductor memory device 1 includes a memory cell array 10, an input/output circuit 11, a logic control circuit 12, an address register 13, a command register 14, a sequencer 15, a driver module 16, a row decoder module 17, and a sense amplifier module 18.

The memory cell array 10 contains a plurality of blocks BLK0 to BLK(k−1) (k is an integer equal to or greater than 2). Each block BLK is a set of memory cell transistors capable of storing data in a nonvolatile manner. Each block BLK is used as, for example a data erase unit. That is, data stored in the memory cell transistors included in the same block BLK is collectively erased. A plurality of bit lines and a plurality of word lines are provided in the memory cell array 10. A plurality of bit lines and a plurality of word lines will be described later. Each memory cell transistor is associated with a single bit line and a single word line. A detailed configuration of the memory cell array 10 will be described later.

The input/output circuit 11 transmits and receives signals DQ<7:0> to and from the memory controller 2. The input/output circuit 11 transfers the address ADD and the command CMD included in the signal DQ<7:0> to the address register 13 and the command register 14, respectively. The input/output circuit 11 also transmits and receives the data DAT to and from the sense amplifier module 18.

The logic control circuit 12 receives, for example, the signals DQS, /DQS, /CE, CLE, ALE, /WE, /RE, RE, and /WP from the memory controller 2. The logic control circuit 12 controls the input/output circuit 11 based on the received signal. The logic control circuit 12 generates and transmits a signal /RB to the memory controller 2.

The address register 13 stores the address ADD transferred from the input/output circuit 11. The address ADD includes, for example, a block address, a column address, and a page address. The block address, the column address, and the page address are associated with a block BLK, a bit line, and a word line, respectively. The address register 13 transfers the stored address ADD to the row decoder module 17 and the sense amplifier module 18.

The command register 14 stores the command CMD transferred from the input/output circuit 11. The command register 14 transfers the stored command CMD to the sequencer 15.

The sequencer 15 receives a command CMD from the command register 14 and controls the entire semiconductor memory device 1 according to a sequence that is based on the received command CMD. For example, in a case where the sequencer 15 receives an erase command, a write command, or a read command, the sequencer 15 instructs the driver module 16 to generate a voltage for use in the corresponding operation.

The driver module 16 generates voltages for use in the erase operation, the write operation, the read operation, etc., and supplies the generated voltages to the memory cell array 10, the row decoder module 17, the sense amplifier module 18, etc., based on the instructions from the sequencer 15.

The row decoder module 17 receives the block address in the address ADD from the address register 13, and selects one of the blocks BLK0 to BLK(k−1) based on the received block address. The row decoder module 17 supplies the voltage supplied from the driver module 16 to, for example, the selected block BLK.

The sense amplifier module 18 receives a column address in the address ADD from the address register 13. The sense amplifier module 18 transfers data DAT between the memory controller 2 and the memory cell array 10 based on the column address. More specifically, during the write operation, the sense amplifier module 18 receives write data from the input/output circuit 11. The sense amplifier module 18 transfers the aforementioned write data to the memory cell array 10. In addition, the sense amplifier module 18 generates read data by sensing a threshold voltage of a memory cell transistor targeted for the read operation in the memory cell array 10. The sense amplifier module 18 transfers the read data to the input/output circuit 11.

1.1.4 Circuit Configuration of Memory Cell Array

An example of a circuit configuration of the memory cell array 10 will be described with reference to FIG. 3. FIG. 3 is a circuit diagram for illustrating a configuration of the memory cell array of the semiconductor memory device according to the embodiment. FIG. 3 shows one block BLK of the plurality of blocks BLK included in the memory cell array 10. In the example shown in FIG. 3, the block BLK includes five string units, SU0, SU1, SU2, SU3, and SU4.

Each of the string units SU includes a plurality of NAND strings NS respectively associated with bit lines BL0 to BL(m−1) (m is an integer equal to or greater than 2). Each NAND string NS includes, for example, memory cell transistors MT0 to MT7 and select transistors ST1 and ST2. Each of the memory cell transistors MT0 to MT7 includes a control gate and a charge storage film. Each of the memory cell transistors MT0 to MT7 stores data in a nonvolatile manner. The select transistors ST1 and ST2 are used to select a string unit SU in various operations. In the description below, if the bit lines BL0 to BL(m−1) are not distinguished from each other, each of them will be simply referred to as a "bit line BL". If the memory cell transistors MT0 to MT7 are not distinguished from each other, each of them will be simply referred to as a "memory cell transistor MT". Furthermore, if the select transistors ST1 and ST2 are not distinguished from each other, each of them will be simply referred to as a "select transistor ST".

In each NAND string NS, the memory cell transistors MT0 to MT7 are coupled in series. A first end of the select transistor ST1 is coupled to the bit line BL associated with the aforementioned select transistor ST1. A second end of the select transistor ST1 is coupled to one end of the serially coupled memory cell transistors MT0 to MT7. A first end of the select transistor ST2 is coupled to the other end of the serially coupled memory cell transistors MT0 to MT7. A second end of the select transistor ST2 is coupled to a source line SL.

Control gates of the memory cell transistors MT0 to MT7 in the same block BLK are respectively coupled to the word lines WL0 to WL7. Gates of the select transistors ST1 in the string units SU0 to SU4 are respectively coupled to select gate lines SGD0 to SGD4. On the other hand, gates of the plurality of select transistors ST2 are coupled in common to the select gate line SGS. However, this is not a limitation, and the gates of the select transistors ST2 may be coupled to the plurality of select gate lines SGS which are different for each string unit SU. In the description below, if the word lines WL0 to WL7 are not distinguished from each other, each of them will be simply referred to as a "word line WL". Furthermore, if the select gate lines SGD0 to SGD4 are not distinguished from each other, each of them will be simply referred to as a "select gate line SGD".

The bit lines BL0 to BL(m−1) are respectively assigned different column addresses. Each bit line BL is shared by the NAND strings NS to which the same column address is assigned among a plurality of blocks BLK. A set of word lines WL0 to WL7 is provided for each block BLK. The source line SL is shared by, for example, the plurality of blocks BLK.

A group of memory cell transistors MT commonly coupled to a word line WL in one string unit SU may be referred to as a cell unit CU. A storage capacity of the cell unit CU, constituted by the memory cell transistors MT each adapted to store 1-bit data, is defined as, for example, "1-page data". Each cell unit CU may have a storage capacity of 2-page data or more according to the bit number of data that the memory cell transistors MT are adapted to store.

The circuit configuration of the memory cell array 10 is not limited to the configuration described in the above. For example, the number of string units SU in each block BLK may be a given number. The number of memory cell transistors MT and the number of select transistors ST1 and ST2 included in each NAND string NS may be a given number.

1.1.5 Structure of Memory Cell Array

Next, a structure of the memory cell array 10 will be described. Note that in the drawings to be referred to below, an X direction corresponds to the extending direction of the word line WL. A Y direction corresponds to the extending direction of the bit line BL. A Z direction corresponds to the direction perpendicular to a surface of a semiconductor substrate for use in formation of the semiconductor memory device 1. The planar views use hatching as appropriate for better viewability. The hatching added to the planar views is not necessarily related to the materials or characteristics of the hatched components. The cross-sectional views omit the configuration as appropriate for better viewability. The configuration shown in each drawing is simplified as appropriate.

1.1.5.1 Planar Configuration

A planar structure of the memory cell array 10 will be described with reference to FIG. 4. FIG. 4 is a planar view showing an example of a planar layout of the memory cell array included in the semiconductor memory device according to the embodiment. FIG. 4 shows a region corresponding to one block BLK.

The memory cell array 10 includes a stacked interconnect structure, a plurality of memory pillars MP, a plurality of contacts CC, and a plurality of members SLT and SHE.

The stacked interconnect structure is a structure stacked in the Z direction in accordance with the select gate lines SGD and SGS and the word lines WL0 to WL7. The stacked interconnect structure includes the select gate lines SGD and SGS and the word lines WL0 to WL7. In the following description, each of the select gate lines SGD and SGS and the word lines WL0 to WL7 may be simply referred to as a "stacked interconnect" Each stacked interconnect extends in the X direction.

The stacked interconnect structure is divided into, for example, a memory region MR and a hookup region HR. The memory region MR and the hookup region HR are aligned next to each other in the X direction. In the following description, of the memory region MR and the hookup region HR, the hookup region HR side will be referred to as one end side extending in the X direction. Of the memory region MR and the hookup region HR, the memory region MR side will be referred to as the other end side extending in the X direction.

The memory region MR is a region in which data is substantially stored. The plurality of memory pillars MP are provided in the memory region MR.

The hookup region HR is a region used in coupling between, e.g., the stacked interconnects and the row decoder module 17. The plurality of contacts CC are provided in the hookup region HR.

Each member SLT extends in the X direction. Each member SLT crosses the memory region MR and the hookup region HR in the X direction within the stacked interconnect structure. The plurality of members SLT are aligned in the Y direction. Each member SLT divides the stacked interconnects that are adjacent to each other with the member SLT interposed therebetween. Each region delimited by corresponding members SLT corresponds to one block BLK. Each member SLT has, for example, a structure into which an insulator and a plate-shaped contact are embedded.

Each member SHE extends in the X direction. Each member SHE crosses the memory region MR in the X direction within the stacked interconnect structure. The plurality of members SHE are aligned in the Y direction. Each member SHE has, for example, a structure into which an insulator is embedded. Each member SHE divides the select gate lines SGD that are adjacent to each other with the member SHE interposed therebetween. Each region delimited by corresponding members SLT and SHE corresponds to one string unit SU.

In the following description, of five string units SU in each block BLK, the string unit SU0 side will be referred to as "one end side in the Y direction". In the following description, of five string units SU in each block BLK, the string unit SU4 side will be referred to as "the other end side in the Y direction".

In the hookup region HR, the select gate lines SGS and SGD and the word lines WL0 to WL7 have a plurality of terrace portions not overlapping with the upper conductive layers.

The plurality of terrace portions are provided with the plurality of contacts CC. The contacts CC are each electrically coupled to the row decoder module 17. In this manner, a voltage is supplied to each of the select gate lines SGS and SGD and the word lines WL0 to WL7 via a corresponding one of the contacts CC.

In the memory region MR, each of the memory pillars MP functions, for example, as one NAND string NS. With such a configuration, the memory cell array 10 stores data. The block BLK includes the plurality of memory pillars MP aligned in the Y direction. In each row of the memory pillars MP, the plurality of memory pillars MP are aligned in the X direction. In the example shown in FIG. 5, for example, 24 columns of the memory pillars MP are aligned in the Y direction in each block BLK. The plurality of memory pillars MP are arranged in, for example, a staggered manner. Furthermore, the plurality of memory pillars MP are provided in such a manner that the members SHE overlap with the memory pillars MP in, for example, the fifth row, the 10th row, the 15th row, and the 20th row counted from one end side in the Y direction.

With such a configuration, in the memory region MR of each block BLK extending in the x direction, the memory pillars MP on one end side extending in the X direction may be each provided in a position physically closer to the plurality of contacts CC coupled to the row decoder module 17 than the memory pillars MP provided on the other end side extending in the X direction. With such a configuration, in the memory region MR of each block BLK, the one end side and the other end side extending in the X direction will be referred to as a "near side" and a "far side", respectively. Furthermore, with such a configuration, the memory region MR of each block BLK includes a region on the near side and a region on the far side which are aligned adjacent to each other in order from the one end side to the other end side extending in the X direction.

In the memory cell array 10, the planar layout described above is repeatedly arranged in the Y direction.

Note that the planer layout of the memory cell array 10 is not limited to the layout described above. For example, the number of members SHE arranged between the adjacent members SLT may be freely designed in accordance with the number of string units SU. The number and arrangement of memory pillars MP in each block BLK are not limited to those in the configuration described with reference to FIG. 4, and may be altered as appropriate.

1.1.5.2 Cross-Sectional Structure

Next, the cross-sectional structure of the memory cell array 10 will be described.

The cross-sectional structure of the memory cell array 10 according to the embodiment will be described with reference to FIG. 5. FIG. 5 is a cross-sectional view, taken along line V-V of FIG. 4, showing an example of the cross-sectional structure of the memory cell array of the semiconductor memory device according to the embodiment. FIG. 5 shows an example of the cross-sectional structure of the memory cell array 10, along the YZ plane.

The memory cell array 10 further includes a semiconductor substrate 40, conductive layers 41 to 45, and insulating layers 30 to 34.

More specifically, the insulating layer 30 is provided on the semiconductor substrate 40. The insulating layer 30 includes, for example, circuits (not shown) such as the row decoder module 17 and the sense amplifier module 18. In the following description, the side on which the memory cell array 10 is provided with respect to the semiconductor substrate 40 will be referred to as an "upper side".

The conductive layer 41 is provided on the insulating layer 30. The conductive layer 41 is formed in, for example, a plate shape extending along the XY plane. The conductive layer 41 is used as the source line SL. The conductive layer 41 contains, for example, silicon doped with phosphorus.

The insulating layer 31 is provided on the conductive layer 41. The conductive layer 42 is provided on the insulating layer 31. The conductive layer 42 is formed in, for example, a plate shape extending along the XY plane. The conductive layer 42 is used as the select gate line SGS. The conductive layer 42 contains, for example, tungsten.

The plurality of insulating layers 32 and the plurality of the conductive layers 43 are alternately stacked on the conductive layer 42. In particular, the plurality of insulating layers 32 and the plurality of conductive layers 43 are stacked in the upward direction in order of the insulating layer 32, the conductive layer 43, the insulating layer 32, . . . , the conductive layer 43, the insulating layer 32, and the conductive layer 43. The conductive layer 43 is formed into, for example, a plate shape extending along the XY plane. The stacked conductive layers 43 are used as word lines WL0 to WL7, respectively, sequentially from the side of the semiconductor substrate 40. The conductive layer 43 contains, for example, tungsten.

The insulating layer 33 is provided on the uppermost conductive layer 43. The conductive layer 44 is provided on the insulating layer 33. The conductive layer 44 is formed in, for example, a plate shape extending along the XY plane. The conductive layer 44 is used as a select gate line SGD. The conductive layer 44 includes, for example, tungsten.

The insulating layer 34 is provided on the conductive layer 44. The plurality of conductive layers 45 are provided on the insulating layer 34. Each of the conductive layers 45 is formed in, for example, a linear shape extending in the Y direction. Each of the conductive layers 45 is used as the bit line BL. The conductive layer 45 contains, for example, copper.

Each of the memory pillars MP extends in the Z direction, and penetrates the insulating layers 31 to 33 and the conductive layers 42 to 44. The bottom portion of each memory pillar MP is in contact with the conductive layer 41. A portion where each memory pillar MP and the conductive layer 42 intersect each other functions as the select transistor ST2. A portion where the memory pillar MP and one conductive layer 43 cross each other functions as one memory cell transistor MT. A portion where each memory pillar MP and the conductive layer 44 intersect each other functions as the select transistor ST1.

Each memory pillar MP includes, for example, a core member 50, a semiconductor layer 51, and a stacked film 52. The core member 50 is arranged to extend in the Z direction. The upper end of the core member 50 is located, for example, above the conductive layer 44. The lower end of the core member 50 is located, for example, at a layer below the conductive layer 42. The semiconductor layer 51 surrounds the core member 50. A part of the semiconductor layer 51 is in contact with the conductive layer 41 at a lower portion of the memory pillar MP. The stacked film 52 covers the side surface and the bottom surface of the semiconductor layer 51, except for a portion at which the semiconductor layer 51 and the conductive layer 41 are in contact with each other. The core member 50 includes, for example, an insulator such as silicon oxide. The semiconductor layer 51 includes, for example, silicon.

A pillar-shaped contact CV is provided on an upper surface of the semiconductor layer 51 of the memory pillar MP. In the illustrated region, one contact CV corresponding to one of the three memory pillars MP is shown. In the memory region MR, the memory pillars MP that do not overlap with the member SHE and that are not coupled to the contact CV are coupled to the corresponding contact CV in a certain region (not shown).

The upper surface of the contact CV is electrically coupled to one conductive layer 45. The contacts CV are provided such that one contact CV is coupled to one conductive layer 45 in each space sectioned by the members SLT and SHE. That is, one memory pillar MP included in each string unit SU is electrically coupled to each conductive layer 45.

The member SLT includes, for example, a portion provided along the XZ plane, and divides the conductive layers 42 to 44. The member SLT includes a contact LI and a spacer SP. The contact LI is a conductor including a portion provided to extend in the X direction. The spacer SP is an insulator provided on the side surface of the contact LI. The contact LI and a stacked interconnect adjacent in the Y direction to this contact LI are separated from each other by the spacer SP. This provides electrical isolation between the contact LI and the stacked interconnect adjacent in the Y direction to this contact LI. Note that the contact LI may be an insulator. In such a case, the contact LI and the spacer SP may be integrally formed.

The member SHE includes, for example, a portion provided along the XZ plane, and divides the conductive layer 44. The lower surface of the member SHE is located, for example, between the uppermost conductive layer 43 and the conductive layer 44. The member SHE contains, for example, an insulator made of silicon oxide, etc.

1.1.5.3 Structure of Memory Pillar

Figure 6:
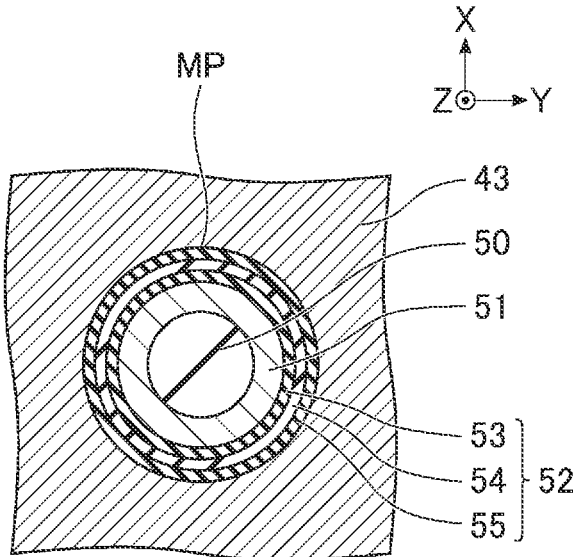
FIG. 6 is a cross-sectional view, taken along line VI-VI of FIG. 5, showing an example of a cross-sectional structure of a memory pillar included in the memory cell array of the semiconductor memory device according to the embodiment.

The structure of the memory pillars MP in the semiconductor memory device 1 according to the embodiment will be described with reference to FIG. 6. FIG. 6 is a cross-sectional view, taken along line VI-VI of FIG. 5, showing an example of a cross-sectional structure of a memory pillar included in the memory cell array of the semiconductor memory device according to the embodiment.

The stacked film 52 includes, for example, a tunnel insulating film 53, an insulating film 54, and a block insulating film 55.

In the cross section including the conductive layer 43, the core member 50 is provided in the middle of the memory pillar MP. The core member 50 has, for example, a circular shape in the XY plane. The semiconductor layer 51 surrounds the side surface of the core member 50. The tunnel insulating film 53 surrounds the side surface of the semiconductor layer 51. The insulating film 54 surrounds the side surface of the tunnel insulating film 53. The block insulating film 55 surrounds the side surface of the insulating film 54. The conductive layer 43 surrounds the side surface of the block insulating film 55. Each of the tunnel insulating film 53 and the block insulating film 55 contains, for example, silicon oxide. The insulating film 54 contains, for example, silicon nitride.

With such a configuration, the memory pillar MP has, for example, a circular shape in the XY plane.

In the above memory pillar MP, the semiconductor layer 51 functions as a current path for the memory cell transistors MT0 to MT7, and the select transistors ST1 and ST2. Furthermore, the insulating film 54 is used as a charge storage layer of the memory cell transistor MT. The semiconductor memory device 1 causes a current to flow into the memory pillar MP between the bit line BL and the source line SL by turning on the memory cell transistors MT0 to MT7 and the select transistors ST1 and ST2.

1.1.6 Threshold Voltage Distribution of Memory Cell Transistor

Figure 7:
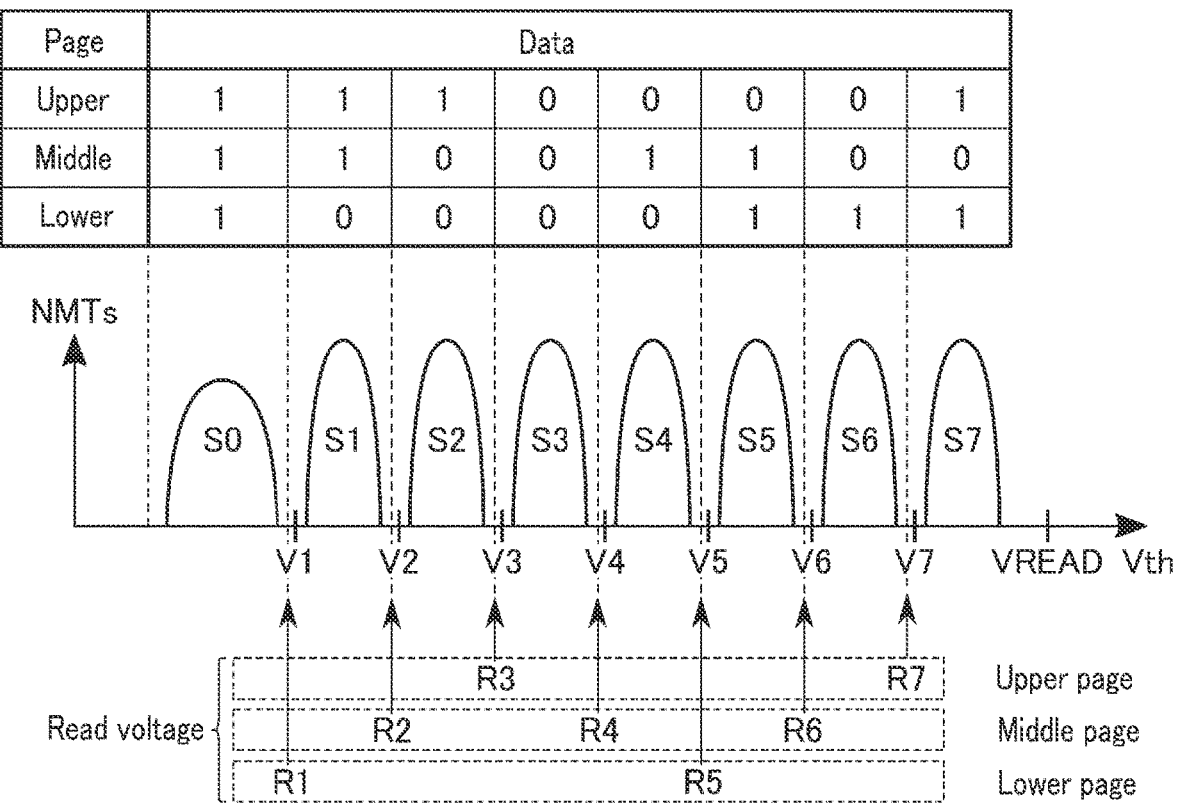
FIG. 7 is a schematic diagram showing one example of threshold voltage distributions of memory cell transistors included in the memory cell array of the semiconductor memory device according to the embodiment.

The threshold voltage distributions of the memory cell transistors MT in the semiconductor memory device according to the embodiment will be described with reference to FIG. 7. FIG. 7 is a schematic diagram showing one example of threshold voltage distributions of the memory cell transistors included in the memory cell array of the semiconductor memory device according to the embodiment. In the threshold voltage distributions shown in FIG. 7, the horizontal axis corresponds to the threshold voltages of the memory cell transistors MT. The vertical axis corresponds to the number of memory cell transistors MT. FIG. 7 shows a value NMTs as the number of memory cell transistors MT.

In the semiconductor memory device 1 according to the embodiment, for example, eight states are formed in accordance with the threshold voltages of the memory cell transistors MT in each block BLK. Hereinafter, the eight state will be referred to as an "S0" state, an "S1" state, an "S2" state, an "S3" state, an "S4" state, an "S5" state, an "S6" state, and an "S7" state in ascending order of threshold voltage. The number of memory cell transistors MT included in each of the "S0" state to the "S7" state is, for example, substantially equal between the states.

The "S0" state corresponds to, for example, a data erase state. The threshold voltage of the memory cell transistors MT included in the "S0" state is smaller than voltage R1.

The "S1", "S2", "S3", "S4", "S5", "S6", and "S7" states correspond to a state in which data is written. The threshold voltage of the memory cell transistors MT included in the "S1" state is equal to or greater than the voltage R1 and is smaller than voltage R2 (where R2>R1). The threshold voltage of the memory cell transistors MT included in the "S2" state is equal to or greater than the voltage R2 and is smaller than voltage R3 (where R3>R2). The threshold voltage of the memory cell transistors MT included in the "S3" state is equal to or greater than the voltage R3 and is smaller than voltage R4 (where R4>R3). The threshold voltage of the memory cell transistors MT included in the "S4" state is equal to or greater than the voltage R4 and is smaller than voltage R5 (where R5>R4). The threshold voltage of the memory cell transistors MT included in the "S5" state is equal to or greater than the voltage R5 and is smaller than voltage R6 (where R6>R5). The threshold voltage of the memory cell transistors MT included in the "S6" state is equal to or greater than the voltage R6 and is smaller than voltage R7 (where R7>R6). The threshold voltage of the memory cell transistors MT included in the "S7" state is equal to or greater than the voltage R7 and is smaller than voltage VREAD (where VREAD>R7). The voltage VREAD is a voltage that turns on a memory cell transistor MT regardless of which one of the "S0" to "S7" states corresponds to the memory cell transistor MT in a case where the voltage VREAD is supplied to a control gate of the memory cell transistor MT.

In response to a voltage being supplied to a control gate of a memory cell transistor MT, the memory cell transistor MT is turned on in a case where it has a threshold voltage smaller than the supplied voltage. In response to a voltage being supplied to a control gate of a memory cell transistor MT, the memory cell transistor MT is turned off in a case where it has a threshold voltage equal to or greater than the supplied voltage.

Different pieces of 3-bit data are allocated to the eight types of threshold voltage distributions of the memory cell transistors MT described above. An example of data allocation to the threshold voltage distribution will be listed below. In the following, data allocated to each state is indicated in the order of "upper bit, middle bit, and lower bit" in correspondence with the state.

"S0" state: "1, 1, 1" data
"S1" state: "1, 1, 0" data
"S2" state: "1, 0, 0" data
"S3" state: "0, 0, 0" data
"S4" state: "0, 1, 0" data
"S5" state: "0, 1, 1" data
"S6" state: "0, 0, 1" data
"S7" state: "1, 0, 1" data In a case where such data allocation is applied, 1-page data (lower page data) constituted by the lower bits is determined by the read operation using each of the voltages R1 and R5. One-page data constituted by the middle bit (middle-page data) is confirmed by a read operation using each of the voltages R2, R4, and R6. One-page data constituted by the upper bit (upper-page data) is confirmed by the read operation using each of the voltages R3 and R7.

A verify voltage used to determine a threshold voltage of the memory cell transistors MT during the write operation is set to each of the adjacent states. More specifically, a voltage V1 is set as a verify voltage between the "S0" state and the "S1" state. The voltage V1 is greater than the voltage R1. A voltage V2 is set as a verify voltage between the "S1" state and the "S2" state. The voltage V2 is greater than the voltage R2. A voltage V3 is set as a verify voltage between the "S2" state and the "S3" state. The voltage V3 is greater than the voltage R3. A voltage V4 is set as a verify voltage between the "S3" state and the "S4" state. The voltage V4 is greater than the voltage R4. A voltage V5 is set as a verify voltage between the "S4" state and the "S5" state. The voltage V5 is greater than the voltage R5. A voltage V6 is set as a verify voltage between the "S5" state and the "S6" state. The voltage V6 is greater than the voltage R6. A voltage V7 is set as a verify voltage between the "S6" state and the "S7" state. The voltage V7 is greater than the voltage R7.

In the description of the semiconductor memory device 1 according to the embodiment, the case is described in which each memory cell transistor stores 3-bit data. However, this case is not a limitation. The semiconductor memory device 1 may be configured in such a manner that each memory cell transistor MT stores 2-bit data or 4-or-more bit data.

1.1.7 Configuration of Memory Cell Array, Driver Module, and Row Decoder Module

Next, a coupling relationship between the memory cell array 10, the driver module 16, and the row decoder module 17 will be described with reference to FIG. 8. FIG. 8 is a block diagram showing one example of a configuration of the memory cell array, a driver module, and the row decoder module included in the semiconductor memory device according to the embodiment.

The row decoder module 17 includes row decoders RD0 to RD(k−1). The row decoders RD0 to RD(k−1) are used to select a block BLK. The row decoders RD0 to RD(k−1) BLK0 are associated with the blocks BLK0 to BLK(k−1), respectively.

Each row decoder RD includes, for example, a block decoder BD and transistors TR0 to TR19. The transistors TR0 to TR19 are, for example, high-withstand-voltage N-channel metal-oxide-semiconductor field effect transistors (MOSFETs). The transistors TR0 to TR14 are associated with the select gate line SGS included in each block BLK. The transistors TR1 to TR8 are respectively associated with the word lines WL0 to WL7 included in each block BLK. The transistors TR9 and TR15 are associated with the select gate line SGD0 included in each block BLK. The transistors TR10 to TR16 are associated with the select gate line SGD1 included in each block BLK. The transistors TR11 to TR17 are associated with the select gate lines SGD2 included in each block BLK. The transistors TR12 and TR18 are associated with the select gate line SGD3 included in each block BLK. The transistors TR13 to TR19 are associated with the select gate line SGD4 included in each block BLK.

The block decoder BD decodes a block address in the address ADD. The block decoder BD applies a voltage of an "H (High)" level and a voltage of an "L (Low)" level to transfer gate lines TG and bTG, respectively, based on, for example, the decoding result. The block decoder BD supplies a voltage at the "L" level to the transfer gate line bTG while supplying a voltage at the "H" level to the transfer gate line TG. In addition, the block decoder BD supplies a voltage at the "H" level to the transfer gate line bTG while supplying a voltage at the "L" level to the transfer gate line TG.

The transistors TR0 to TR19 associated with each block BLK couple the driver module 16 to the block BLK concerned via the signal lines SGSD, CG0 to CG7, SGDD0 to SGDD4, USGS, and USGD. In the description below, if the signal lines SGSD, CG0 to CG7, SGDD0 to SGDD4, USGS, and USGD are not distinguished from each other, each of them will be simply referred to as a "word line CG".

More specifically, in each row decoder RD, the gate of the transistor TR0 is coupled to the transfer gate line TG. A first end of the transistor TR0 is coupled to the driver module 16 via the signal line SGSD. A second end of the transistor TR0 is coupled to the select gate line SGS.

Gates of the transistors TR1 to TR8 are coupled to the transfer gate line TG. First ends of the transistors TR1 to TR8 are coupled to the driver module 16 via the signal lines CG0 to CG7, respectively. Second ends of the transistors TR1 to TR8 are respectively coupled to the word lines WL0 to WL7.

Gates of the transistors TR9 to TR13 are coupled to the transfer gate line TG. First ends of the transistors TR9 to TR13 are coupled to the driver module 16 via the signal lines SGDD0 to SGDD4, respectively. Second ends of the transistors TR9 to TR13 are respectively coupled to the select gate lines SGD0 to SGD4.

A gate of the transistor TR14 is coupled to the transfer gate line bTG. A first end of the transistor TR14 is coupled to the driver module 16 via the signal line USGS. A second end of the transistor TR14 is coupled to the select gate line SGS together with a second end of the transistor TR0.

Gates of the transistors TR15 to TR19 are coupled to the transfer gate line bTG. First ends of the transistors TR15 to TR19 are coupled to the driver module 16 via the signal lines USGD. Second ends of the transistors TR15 to TR19 are coupled to the select gate lines SGD0 to SGD4 together with the second ends of the transistors TR9 to TR13, respectively.

In a case where a voltage at the "H" level is supplied to the transfer gate line TG, the transistors TR0 to TR13 are turned on. By this, voltages of the signal lines SGDD, CG0 to CG7, and SGDD0 to SGDD4 are transferred to the select gate line SGS, the word lines WL0 to WL7, and the select gate lines SGD0 to SGD4 via the transistors TR0 to TR13, respectively. In a case where a voltage at the "L" level is supplied to the transfer gate line TG, the transistors TR0 to TR13 are turned off.

In a case where a voltage at the "H" level is supplied to the transfer gate line bTG (a case where a voltage at the "L" level is supplied to the transfer gate line TG), the transistors TR14 to TR19 are turned on. By this, the voltage of the signal line USGS is transferred to the select gate line SGS via the transistor TR14. The voltage of the signal line USGD is transferred to the select gate lines SGD0 to SGD4 via the transistors TR15 to TR19. In a case where a voltage at the "L" level is supplied to the transfer gate line bTG (a case where a voltage at the "H" level is supplied to the transfer gate line TG), the transistors TR14 to TR19 are turned off. The voltages of the signal lines USGS and USGD are, for example, a voltage VSS. The voltage VSS is a ground voltage. That is, in a case where a voltage at the "H" level is supplied to the transfer gate line bTG of the row decoder RD, the voltage VSS is supplied to the select gate lines SGS and SGD0 to SGD4 of the block BLK corresponding to the aforementioned row decoder RD (the select transistors ST1 and ST2 are turned off).

Each of the select gate lines SGS and SGD0 to SGD4 and the word lines WL0 to WL7 in each block BLK is configured such that an interconnect length between a portion included in the region on the near side and the row decoder RD associated with the block BLK concerned or the driver module 16 is smaller than an interconnect length between a portion included in the region on the far side and the aforementioned row decoder RD or the driver module 16.

1.1.8 Sense Amplifier Module

Next, a configuration of the sense amplifier module 18 will be described with reference to FIG. 9. FIG. 9 is a block diagram showing an example of a configuration of a sense amplifier module of the semiconductor memory device according to the embodiment.

The sense amplifier module 18 includes sense amplifier units SAU0 to SAU(m−1). The sense amplifier units SAU0 to SAU(m−1) are associated respectively with the bit lines BL0 to BL(m−1). In the following description, if the sense amplifier units SAU0 to SAU(m−1) are not distinguished from each other, each of them will be simply referred to as a "bit line SAU". Each sense amplifier unit SAU includes, for example, a sense amplifier SA and latch circuits SDL, ADL, BDL, CDL, and XDL.

The sense amplifier SA and the latch circuits SDL, ADL, BDL, CDL, and XDL are coupled in common to a bus LBUS. The latch circuits SDL, ADL, BDL, CDL, and XDL can transmit and receive data therebetween.

A strobe signal STB generated by the sequencer 15 is input to each sense amplifier section SA. The sense amplifier portion SA senses whether a threshold voltage of the selected memory cell transistor MT is equal to or greater than a read voltage, based on a timing at which the strobe signal STB is asserted. That is, the sense amplifier SA is a circuit configured to directly control reading of data stored in the selected memory cell transistor MT.

Each of the latch circuits SDL, ADL, BDL, CDL, and XDL temporarily stores data. The latch circuit XDL is used for the input/output of data DAT between the input/output circuit of the semiconductor memory device 1 and the sense amplifier unit SAU. The latch circuit XDL may also be used as, for example, a cache memory CM of the semiconductor memory device 1.

1.2 Operation

Next, the operations using the semiconductor memory device 1 according to the embodiment will be described.

In the following description, the word line WL selected based on an address ADD will be referred to as a "selected word line WLn". Furthermore, the word line WL not selected will be referred to as a "non-selected word line WLusel". Of the non-selected word lines WLusel, each of the word lines WLusel that are adjacent to the selected word line WLn in the Z direction will be referred to as an "adjacent word line WLn±1". Of the non-selected word lines WLusel, all the word lines WLusel other than the adjacent word line WLn±1 will be referred to as "non-selected word lines WLoth".

The memory cell transistor MT coupled to the selected word line WLn will be referred to as a "selected memory cell transistor MTn".

The signal line CG coupled to the selected word line WLn will be referred to as a selected signal line CGn. The signal line CG coupled to the non-selected word line WLusel will be referred to as a "non-selected signal line CGusel". Of the non-selected signal lines CGusel, the non-selected signal line CGusel coupled to the adjacent word line WLn±1 will be referred to as an "adjacent signal line CGn±1". Of the non-selected signal lines CGusel, the non-selected signal line CGusel coupled to the non-selected word line WLoth will be referred to as a "non-selected to signal line CGoth".

1.2.1 Overview of Write Operation

An overview of the write operation will be described with reference to FIG. 10. FIG. 10 is a timing chart showing an overview of the write operation of the semiconductor memory device according to the embodiment.

The semiconductor memory device 1 repeatedly performs a program loop in the write operation. FIG. 10 shows a change in a voltage of the selected word line WLn accompanied by an increase in the number of times the program loop is performed during the write operation (hereinafter referred to as a "loop number"). Each program loop operation includes a program operation (Program) and a write verify operation (Verify). Hereinafter, the write verify operation will be simply referred to as a "verify operation". The semiconductor memory device 1 increases a threshold voltage of the memory cell transistor MT to a target voltage by repeating the program loop operation.

In each program loop operation, the sequencer 15 executes the program operation before the verify operation.

The program operation is an operation that may increase a threshold voltage of the memory cell transistor MT. In the program operation, the plurality of select memory cell transistors MTn are set to program-target or program-inhibit based on write data stored in the associated sense amplifier units SAU. In a case where a threshold voltage of the selected memory cell transistor MTn has not reached a target threshold voltage, the aforementioned selected memory cell transistor MTn is set to program-target. Meanwhile, in a case where the threshold voltage of the selected memory cell transistor MTn has reached the target threshold voltage, the aforementioned selected memory cell transistor MTn is set to program-inhibit.

In the program operation, a voltage VPGM is supplied to the selected word line WLn. The voltage VPGM is a voltage that can increase the threshold voltage of the selected memory cell transistor MTn. The voltage VPGM increases as the loop number increases. In the example shown in FIG. 10, the voltage VPGM increases by a voltage dVP as the loop number increases. In response to the voltage VPGM being supplied to the selected word line WLn, the threshold voltage of the selected memory cell transistor MTn set to program-target increases. On the other hand, an increase in the threshold voltage of the selected memory cell transistor MTn set to program-inhibit is suppressed (the threshold voltage is maintained).

Hereinafter, the operation of increasing a threshold voltage of the memory cell transistor MT will be referred to as a "0" program operation, and the operation of maintaining the threshold voltage of the memory cell transistor MT will be referred to as a "1" program operation.

Upon completion of the program operation, the sequencer 15 performs the verify operation.

The verify operation is a read operation of confirming whether or not a threshold voltage of the selected memory cell transistor MTn has reached a target threshold voltage. The sequencer 15 executes, in each program operation, for example, the read operation using a predetermined verify voltage with respect to the selected memory cell transistor MTn set to program-target.

FIG. 10 shows the example in which one verify voltage is used in each verify operation; however, this example is not a limitation. A plurality of verify voltages may be used in each verify operation. In such a case, for example, the read operations each using the plurality of verify voltages are sequentially executed.

In the verify operation, the sense amplifier unit SAU determines based on a voltage of the bit line BL whether or not a threshold voltage of the selected memory cell transistor MTn is greater than the verify voltage supplied to the selected word line WLn. With respect to the selected memory cell transistor MTn whose threshold value is determined to be greater than the verify voltage, the sense amplifier unit SAU determines "verify pass". On the other hand, with respect to the selected memory cell transistor MTn whose threshold voltage is equal to or smaller than the verify voltage, each sense amplifier unit SAU determines "verify fail". Each sense amplifier unit SAU causes one of the latch circuits SAU therein to store a verify result described above. Upon completion of the verify operation, the sequencer 15 sets each selected memory cell transistor MTn to program-target or program-inhibit based on a result of the verify operation, and initiates the next program loop operation.

1.2.2 Program Loop Operation

Each program loop operation according to the embodiment will be described with reference to FIG. 11. FIG. 11 is a timing chart showing an example of a program loop operation of the semiconductor memory device according to the embodiment. FIG. 11 shows changes in voltage of the word lines WL, the select gate lines SGS and SGD, the bit line BL, and the source line SL.

Regarding the voltages of the bit lines BL shown in FIG. 11, the solid line corresponds to the bit line BL corresponding to the memory cell transistor MT targeted for the "1" program operation (hereinafter referred to as a bit line BL("1")). The dashed-dotted line corresponds to the bit line BL corresponding to the memory cell transistor MT targeted for the "0" program operation (hereinafter referred to as a bit line BL("0")).

The program operation is executed from time t0 to time t5.

At the time t0, the sense amplifier module 18 supplies the voltage VBL to the bit line BL("1"), thereby performing BL precharge. The voltage VBL is, for example, a voltage greater than the voltage VSS (VBL>VSS). On the other hand, the voltage VSS is supplied to the bit line BL("0").

The row decoder module 17 selects one of the blocks BLK. Furthermore, the row decoder module 17 selects one of the string units SU. The row decoder module 17 then supplies the voltage VS to the selected gate line SGD in the selected string unit SU (selected string unit SU). The row decoder module 17 supplies the voltage VSS to the selected gate line SGD of the non-selected string unit SU. The voltage VS is a voltage that turns on the select transistor ST1 in which the voltage VSS has been supplied to the bit line BL and turns off the select transistor ST1 in which the voltage VBL has been supplied to the bit line BL.

In the following description, the selected gate line SGD in the selected string unit SU will be referred to as a "selected gate line SGDsel". Furthermore, the selected gate line SGD in the non-selected string unit SU will be referred to as a "selected gate line SGDusel".

The row decoder module 17 turns off the select transistor ST2 by supplying the voltage VSS to the selected gate line SGS.

Furthermore, the driver module 16 supplies the voltage VSL to the source line SL. The voltage VSL is greater than the voltage VSS.

Through the processing described above, a channel of the NAND string NS corresponding to the bit line BL("1") is brought into a floating state in which the channel is electrically insulated from the bit line BL and the source line SL.

In the manner described above, the "0" program operation and the "1" program operation can be set for each bit line BL in the same program operation.

The row decoder module 17 selects one of the word lines WL in the selected block BLK.

At the time t1, the driver module 16 initiates supply of the voltage VPGM to the selected signal line CGn. The row decoder module 17 then initiates supply of the voltage VPGM to the selected word line WLn. This increases a voltage of the selected word line WLn to a value substantially equal to the voltage VPGM.

The driver module 16 initiates supply of the voltage VPASS to the adjacent signal line CGn±1 and the non-selected signal lines CGusel including the non-selected signal line CGoth. The row decoder module 17 then initiates supply of the voltage VPASS to the non-selected word line WLusel. This increases a voltage of the non-selected word line WLusel up to a value substantially equal to the voltage VPASS.

In the NAND string NS corresponding to the bit line BL("0"), the select transistor ST1 is in the on state. Accordingly, a channel potential of the memory cell transistor MT coupled to the selected word line WLn becomes VSS. This increases a potential difference (VPGM–VSS) between the control gate and the channel. As a result, by electrons being injected into a charge storage layer, the threshold voltage of the memory cell transistor MT increases.

On the other hand, in the NAND string NS corresponding to the bit line BL("1"), a channel of the memory cell transistor MT coupled to the selected word line WLn is in a floating state. In such a case, for example, a channel potential is increased by capacitance coupling between the channel and the word line WL. This decreases a potential difference between the control gate and the channel. As a result, electrons are injected very little into the charge storage layer, so that the threshold voltage of the memory cell transistor MT is maintained.

At the time t2, the driver module 16 initiates supply of, for example, a voltage VP-V to the selected signal line CGn and the non-selected signal line CGoth. The row decoder module 17 supplies, for example, the voltage VP-V to the selected word line WLn and the non-selected word line WLoth. The driver module 16 initiates supply of the voltage VCGn±1 to the adjacent signal line CGn±1. The row decoder module 17 supplies the voltage VCGn±1 to the adjacent word line WLn±1. The voltage VP-V is, for example, equal to or greater than the voltage VSS (VP-V≥VSS). That is, the voltage VP-V may be equal to the voltage VSS. The voltage VCGn±1 is a voltage greater than the voltage VP-V (VCGn±1>VP-V). Furthermore, the voltages VP-V and VCGn±1 are smaller than the voltages VPASS and VREAD (VCGn±1, VP-V<VPASS, VREAD).

Each of the voltages of the selected word line WLn and the non-selected word line WLoth becomes a voltage substantially equal to the voltage VP-V depending on voltages transferred from the selected word line CGn and the non-selected word line CGoth.

Furthermore, the adjacent word line WLn±1 may quickly respond to the voltage transferred from the adjacent signal line CGn±1 in the region on the near side. By this, a voltage of the adjacent word line WLn±1 (WLn±1 (near)) in the region on the near side is hardly affected by a voltage of the selected word line WLn, and becomes a voltage substantially equal to the voltage VCGn±1, for example.

On the other hand, the adjacent word line WLn±1 is significantly affected by coupling caused by a drop in a voltage of the selected word line WLn from the voltage VPGM down to the voltage VP-V in the region on the near side as compared to the region on the far side. By this, a voltage of the adjacent word line WLn±1 (WLn±1 (far)) in the region on the far side becomes smaller than the voltage VCGn±1, for example. The voltage VCGn±1 is set such that a voltage of the adjacent word line WLn±1 (far) becomes substantially equal to or greater than the voltage VP-V. FIG. 11 shows a case in which a voltage of the adjacent word line WLn±1 (far) becomes substantially equal to the voltage VP-V.

At the time t3, the row decoder module 17 supplies the voltage VSS to the selected gate line SGD. The sense amplifier module 18 supplies the voltage VSS to the bit line BL. The driver module 16 supplies the voltage VSS to the source line SL.

At the time t4, the driver module 16 supplies the voltage VP-V to the adjacent signal line CGn±1. The row decoder module 17 then supplies the voltage VP-V to the adjacent signal line WLn±1. By this, a voltage of the adjacent word line WLn±1 becomes substantially equal to the voltage VP-V. That is, all the word lines WL in the selected block BLK become substantially equal in voltage to each other.

Through the operations described above, a charge is injected into a charge storage layer of the memory cell transistor MT targeted for the "0" program operation. Furthermore, the program operation is completed.

At a time subsequent to the time t5, the verify operation is executed.

During the program operation, a period from a start of supply of the voltage VP-V to the selected word line WLn to a start of the verify operation will be referred to as a "period P-V" in the following description. That is, the period P-V corresponds to a period from the time t2 to the time t5.

At the time t5, the row decoder module 17 supplies, for example, the voltage VS to each of the selected gate lines SGS and SGDsel. For example, the voltage VSS is supplied to the selected gate line SGDusel. It suffices that each of the voltages to be supplied to the selected gate lines SGDsel and SGS is a voltage that turns on the select transistors ST1 and ST2, and may be different from the voltage VS. Through the processing described above, the select transistor ST1 and the select transistor ST2 of the selected string unit SU are turned on. Furthermore, the select transistor ST1 of the non-selected string unit SU is turned off.

The driver module 16 initiates supply of the voltage VREAD to the signal lines CG0 to CG7. The row decoder module 17 supplies the voltage VREAD to all the word lines WL of the selected block BLK. By this, all the word lines WL mentioned above are respectively boosted at speeds substantially equal to each other, for example. Then, after a lapse of a predetermined period from the time t5, voltages of all the word lines WL mentioned above increase up to a voltage substantially equal to the voltage VREAD. By this, the memory cell transistors MT in the selected block BLK are turned on.

At the time t6, the driver module 16 initiates supply of the voltage VVRF to the selected signal line CGn. Furthermore, the row decoder module 17 supplies the voltage VVRF to the selected word line WLn. By this, the voltage of the selected word line WLn becomes equal to the voltage VVRF. The voltage VVRF is one of the voltages V1 to V7 set as the verify voltage. That is, the voltage VVRF is smaller than the voltage VREAD (VREAD>VVRF). The voltage VVRF is set in accordance with a threshold voltage of the memory cell transistor MT targeted for the read operation. In a case where a threshold voltage of the memory cell transistor MT targeted for the read operation is greater than the voltage VVRF, the memory cell transistor MT is turned off. In a case where the aforementioned threshold voltage is equal to or smaller than the voltage VVRF, the memory cell transistor MT is turned on.

At a time t7, the sense amplifier module 18 sets a voltage of the bit line BL to the voltage VBL. Meanwhile, at the time t7, a voltage supplied to the bit line BL may be a voltage greater than the voltage VSS different from the voltage VBL, for example.

At a time t8, the driver module 16 initiates supply of the voltage VREAD to the selected signal line CGn. Furthermore, the row decoder module 17 supplies the voltage VREAD to the selected word line WLn. By this, the voltages of all of the word lines WL in the selected block BLK become substantially equal to the voltage VREAD.

At a time t9, the driver module 16 initiates supply of the voltage VSS to the signal lines CG0 to CG7. The row decoder module 17 supplies the voltage VSS to all of the word lines WL in the selected block BLK. By this, the voltages of all of the word lines WL in the selected block BLK become substantially equal to the voltage VSS.

The sense amplifier module 18 supplies the voltage VSS to the bit line BL.

The row decoder module 17 supplies the voltage VSS to the select gate lines SGDsel and SGS.

Through the operations described above, data is read from the memory cell transistor MT corresponding to the selected word line WLn of the selected string unit SU. Then, a determination as to "verify pass" or "verify fail" is made with respect to the memory cell transistor MT from which data has been read.

Meanwhile, FIG. 11 merely shows an example of a timing chart of the program loop operation according to the embodiment, and a magnitude relationship of voltages respectively supplied to the word line WL, the selected gate lines SGS and SGD, the bit line BL, and the source line SL does not necessarily correspond to the magnitude relationship of voltages shown in FIG. 11.

Furthermore, in the example of the program loop operation described above, voltages of the non-selected signals CGusel are substantially equal to each other in both the period from the time t1 to the time t2 and the period from the time t6 to the time t8; however, this example is not a limitation. In each of the period from the time t1 to the time t2 and the period from the time t6 to the time t9, for example, among the non-selected signals CGusel, a voltage of the adjacent signal line CGn±1 may be greater than a voltage of the non-selected signal line CGoth.

1.3 Advantageous Effect

According to the embodiment, the semiconductor memory device 1 can be improved in terms of operation speed. The effects of the embodiment will be discussed below.

The semiconductor memory device 1 according to the embodiment is configured to supply the voltage VPASS to the adjacent word line WLn±1 while supplying the voltage VPGM as a write voltage to the selected word line WLn at the time t1 during the program operation. The semiconductor memory device 1 is configured to supply the voltage VCGn±1 greater than the voltage VP-V to the adjacent word line WLn±1 while supplying, for example, the voltage VP-V to the selected word line WLn at the time t2. With such a configuration, the semiconductor memory device 1 according to the embodiment can facilitate voltage boosting of the word line WL during the verify operation. This can improve the speed of the program loop operation and the write operation. Therefore, the operation speed of the semiconductor memory device 1 can be improved.

As an additional note, in a case where the voltage VP-V is supplied to all of the non-selected word lines during the period P-V, a voltage in the region on the far side of the adjacent word line may be excessively decreased below the voltage in the region on the near side. That is, the voltage in the region of the far side of the adjacent word line may become smaller than the voltage VP-V. In such a case, after a lapse of the period P-V, voltage boosting in the region on the far side of the adjacent word line is undesirably delayed when all of the word lines in the selected block are increased up to the voltage VREAD during the verify operation. For this reason, delay in the program operation and the write operation caused by the delayed verify operation undesirably occurs.

According to the embodiment, the voltage VCGn±1 greater than the voltage VP-V is supplied to the adjacent signal line CGn±1 in the period from the time t2 to the time t4. That can prevent the voltage in the voltage in the region of the far side of the adjacent word line WLn±1 from becoming smaller than the voltage VP-V. That is, even if coupling occurs in the period P-V, the voltage in the region on the far side of the adjacent word line WLn±1 is maintained to be substantially equal to the voltage VP-V, for example. This prevents delay in boosting of the voltage in the adjacent word line WLn±1 at the time of supplying the voltage VREAD to all of the word lines WL in the selected block BLK.

In the period P-V, in a case where the voltage VP-V is supplied to all of the non-selected signal lines, voltage boosting of the adjacent word line may be further delayed due to coupling in the verify operation, too. More specifically, by voltage boosting of the adjacent word line being delayed due to coupling in the program operation, the voltage of the adjacent word line may not reach the voltage VREAD at the time of decreasing the voltage of the selected word line from the voltage VREAD down to the verify voltage in the verify operation. In such a case, the voltage of the selected word line is decreased while the voltage of the adjacent word line is boosted. This changes voltage directions of the selected word line and the adjacent word line to the directions opposite to each other. By this, the effect of coupling between the selected word line and the adjacent word line becomes significant. This may cause further delay in voltage boosting to the voltage VREAD in the adjacent word line, and delay in convergence on the voltage VVRF in the selected word line. This causes further delay in the program operation, thereby causing delay in the program loop operation and the write operation.

According to the embodiment, as described above, excessive voltage drop is prevented in the region on the far side of the adjacent word line WLn±1 during the program operation. By this, at the time t5, when the voltage VREAD is supplied to all of the word lines WL in the selected block BLK, voltages in these word lines WL can be boosted at equal speeds. Accordingly, when the voltage of the selected word line WLn is decreased from the voltage VREAD down to the voltage VVRF, the voltage of the adjacent word line WLn±1 is set to, for example, equal to the voltage VREAD. That is, a voltage of the adjacent word line WLn±1 is prevented from being boosted, and voltage directions of the selected word line WLn and the adjacent word line WLn±1 are prevented from changing to the opposite directions. This can prevent the effect of coupling between the selected word line and the adjacent word line from becoming significant, prevent further delay in voltage boosting of the adjacent word line WLn±1, and also prevent delay in convergence on the voltage VVRF in the selected word line WLn. Accordingly, delay in the verify operation can be prevented.

2. MODIFICATIONS

The above embodiment can be variously modified. A semiconductor memory device according to a modification of the embodiment will be described below.

The above embodiment described the case in which the voltage VCGn±1 is supplied to the signal line CGn±1 in a period between the time t2 and the time t4 in each program loop operation. However, the described case is not a limitation. The semiconductor memory device 1 may be configured such that the voltage VCGn±1 supplied to the signal CGn±1 increases as the number of loops and a voltage of the selected word line WLn increase.

A configuration of the semiconductor memory device 1 according to the modification may be similar to that of the semiconductor memory device 1 according to the embodiment. Hereinafter, an operation of the semiconductor memory device 1 according to the modification will be described, mainly with respect to the matters differing from the operation of the semiconductor memory device 1 according to the embodiment.

Each program loop operation using the semiconductor memory device 1 according to the modification may be similar to that of the semiconductor memory device 1 according to the embodiment. For this reason, hereinafter, a description of the timing chart of the program loop operation will be omitted, while boosting of the voltages VPGM and VCGn±1 along with an increase of the loop number will be described.

The semiconductor memory device 1 according to the modification will be described with reference to FIG. 12. FIG. 12 shows a table for explaining a write operation using a semiconductor memory device according to the modification. FIG. 12 shows an example case in which 18 program loop operations are executed in the write operation. Furthermore, FIG. 12 shows the voltages VPGM and VCGn±1 during a program loop operation of each loop number.

The voltage VPGM in the case of the loop number being value i (in the i-th program loop operation) is expressed as a voltage VP(i). The value i is an integer equal to or greater than 1. The value VP(i) is, for example, a voltage (VP(1)+(i−1)×dVP) obtained by adding the voltage VP(1) to a voltage obtained by multiplying the voltage dVP by a value (i−1).

In the modification, the semiconductor memory device 1 divides the write operation into a plurality of sections SecW1 to SecW3 based on the loop number and the voltage VPGM. Hereinafter, if the plurality of sections SecW1 to SecW3 are not distinguished from each other, each of them will be simply referred to as a "section SecW".

The section SecW1 includes the program loop operation in the case of the program number being 1 to 6. The section SecW2 includes the program loop operation in the case of the program number being 7 to 12. The section SecW3 includes the program loop operation in the case of the program number being 13 to 18.

In the section SecW1, the voltage VCGn±1 supplied to the adjacent signal CGn±1 during the period P-V is set to a voltage VC(1). In the section SecW2, the voltage VCGn±1 supplied to the adjacent signal CGn±1 during the period P-V is set to a voltage VC(2). The voltage VC(2) is greater than the voltage VC(1) (VC(2)>VC(1)). In the section SecW3, the voltage VCGn±1 supplied to the adjacent signal CGn±1 during the period P-V is set to a voltage VC(3). The voltage VC(3) is greater than the voltage VC(2) (VC(3)>VC(2)).

That is, in each program loop operation, for example, in a case where the voltage VPGM supplied to the selected word line WLn is equal to or greater than the voltage VP(1) and smaller than the voltage VP(7), the driver module 16 supplies the voltage VC(1) to the adjacent signal line CGn±1. In each program loop operation, for example, in a case where the voltage VPGM supplied to the selected word line WLn is equal to or greater than the voltage VP(7) and smaller than the voltage VP(13), the driver module 16 supplies the voltage VC(2) to the adjacent signal line CGn±1. In each program loop operation, furthermore, for example, in a case where the voltage VPGM supplied to the selected word line WLn is equal to or greater than the voltage VP(13) and smaller than the voltage VP(18), the driver module 16 supplies the voltage VC(3) to the adjacent signal line CGn±1.

In the following description, the voltage VCGn±1 in the j-th section SecW will be referred to as a "voltage VC(j)". The value j is an integer equal to or greater than 1.

The voltage VC(j) is, for example, a voltage (VC(1)+(j−1)×dVC) obtained by adding the voltage VC(1) to a voltage obtained by multiplying the voltage dVC by a value (j−1). That is, the semiconductor memory device 1 is configured such that a voltage increases by a predetermined value every time a section SecW is shifted to another section SecW as the loop number increases.

The above modification described the example in which the semiconductor memory device 1 divides the write operation into three sections SecW; however, this example is not a limitation. The semiconductor memory device 1 may divide the write operation into two sections SecW or four or more sections SecW. Furthermore, the above modification described the example case in which the number of program loop operations included in each section SecW is made equal between the plurality of sections SecW. However, this example case is not a limitation, and the number of program loop operations executed in each section SecW may be different between the plurality of sections SecW.

Furthermore, the semiconductor memory device 1 may be configured such that, for example, the voltage VCGn±1 increases every time the loop number increases during the write operation.

As described above, the semiconductor memory device 1 according to the modification is configured such that the voltage VCGn±1 supplied to the adjacent signal line CGn±1 is set high in accordance with an increase of the loop number and the voltage VPGM. By this, an excessive voltage drop is prevented in the region on the far side of the adjacent word line WLn±1, caused by an increase of the voltage VPGM supplied to the selected word line WLn.

That is, according to the modification, the semiconductor memory device 1 is configured such that the voltage VCGn±1 is also set high in accordance with an increase of the loop number and the voltage VPGM. Accordingly, by the voltage VPGM increasing, the effect of coupling during the period P-V becomes significant, so that the voltage in the region on the far side of the adjacent word line WLn±1 is prevented from decreasing below the voltage VP-V. With such a configuration also, the operation speed of the semiconductor memory device 1 can be improved.

3. OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell and a second memory cell arranged adjacent to each other and coupled in series;
a first word line coupled to the first memory cell;
a second word line coupled to the second memory cell; and
a control circuit,
wherein:
the control circuit is configured to:
execute a plurality of program loop operations each including a program operation and a verify operation subsequent to the program operation; and
at a time of the program operation in a first program loop operation included in the plurality of program loop operations and targeted for the first memory cell:
during a first period, while suppling a first write voltage to the first word line, supply a first voltage smaller than the first write voltage to the second word line, and
during a second period subsequent to the first period, while supplying a second voltage smaller than the first voltage to the first word line, supply a third voltage greater than the second voltage and smaller than the first voltage to the second word line.

2. The device of claim 1, wherein the control circuit is configured to, at a time of the verify operation in the first program loop operation:
during a third period, supply a fourth voltage greater than the second voltage and the third voltage to the first word line and the second word line; and
during a fourth period subsequent to the third period, while supplying the fourth voltage to the second word line, supply a first verify voltage smaller than the fourth voltage to the first word line.

3. The device of claim 2, wherein the control circuit is configured to, while supplying the second voltage to the first word line, supply the second voltage to the second word line after the second period and before the third period.

4. The device of claim 1, further comprising:
a third memory cell arranged adjacent to the second memory cell and coupled to the first memory cell in series with the second memory cell intervening between the third memory cell and the first memory cell; and
a third word line coupled to the third memory cell,
wherein the control circuit is configured to supply the second voltage to the third word line during the second period.

5. A semiconductor memory device comprising:
a first memory cell and a second memory cell arranged adjacent to each other and coupled in series;
a first word line coupled to the first memory cell;
a second word line coupled to the second memory cell; and
a control circuit,
wherein the control circuit is configured to:
execute a plurality of program loop operations each including a program operation and a verify operation subsequent to the program operation;
at a time of the program operation in a first program loop operation included in the plurality of program loop operations and targeted for the first memory cell:
during a first period, while suppling a first write voltage to the first word line, supply a first voltage smaller than the first write voltage to the second word line; and
during a second period subsequent to the first period, while supplying a second voltage smaller than the first voltage to the first word line, supply a third voltage greater than the second voltage to the second word line; and
at a time of the program operation in a second program loop operation included in the plurality of program loop operations and executed after the first program loop operation and targeted for the first memory cell:
during a fifth period, while supplying a second write voltage greater than the first write voltage to the first word line, supply the first voltage to the second word line; and
during a sixth period after the fifth period, while supplying the second voltage to the first word line, supply a fifth voltage greater than the second voltage to the second word line, and
wherein the control circuit is further configured to:
in a case of the second write voltage being smaller than a sixth voltage, supply the third voltage as the fifth voltage to the second word line; and
in a case of the second write voltage being equal to or greater than the sixth voltage, set the fifth voltage to a voltage greater than the third voltage.

6. The device of claim 5, wherein:

the control circuit is configured to execute the first program loop operation and the second program loop operation in a continuous manner, and the fifth voltage is greater than the third voltage.

7. The device of claim 3, wherein;

the second word line includes a first region and a second region greater in interconnect length from the control circuit than the first region, and during the second period, a voltage in the second region is smaller than a voltage in the first region.

8. The device of claim 7, wherein during the second period, the voltage in the second region is equal to or greater than the second voltage, and the voltage in the first region is greater than the voltage in the second region.

9. The device of claim 2, wherein the third voltage is smaller than the fourth voltage.

10. The device of claim 1, wherein:

the control circuit includes a voltage generator, and the voltage generator is configured to output the first write voltage, the first voltage, the second voltage, and the third voltage.

* * * * *